US008023302B2

(12) United States Patent　　(10) Patent No.: US 8,023,302 B2
Yukawa et al.　　(45) Date of Patent: Sep. 20, 2011

(54) MEMORY DEVICE AND SEMICONDUCTOR DEVICE

(75) Inventors: Mikio Yukawa, Atsugi (JP); Hiroko Abe, Setagaya (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1378 days.

(21) Appl. No.: 11/578,057

(22) PCT Filed: Jan. 26, 2006

(86) PCT No.: PCT/JP2006/301705
§ 371 (c)(1),
(2), (4) Date: Oct. 12, 2006

(87) PCT Pub. No.: WO2006/080550
PCT Pub. Date: Aug. 3, 2006

(65) Prior Publication Data
US 2008/0283616 A1　Nov. 20, 2008

(30) Foreign Application Priority Data
Jan. 31, 2005　(JP) ................................. 2005-024596

(51) Int. Cl.
*G11C 5/02* (2006.01)
(52) U.S. Cl. ................ 365/51; 365/185.15; 365/185.26; 365/185.28
(58) Field of Classification Search .................... 365/51, 365/185.15, 185.26, 185.28
See application file for complete search history.

(56) References Cited

U.S. PATENT DOCUMENTS

| | | | | |
|---|---|---|---|---|
| 5,364,811 A | * | 11/1994 | Ajika et al. ................... | 438/396 |
| 5,866,938 A | | 2/1999 | Takagi et al. | |
| 6,274,388 B1 | | 8/2001 | Aggarwal et al. | |
| 6,458,630 B1 | | 10/2002 | Daubenspeck et al. | |
| 6,872,989 B2 | | 3/2005 | Inoue et al. | |
| 6,900,084 B1 | * | 5/2005 | Yamazaki ..................... | 438/158 |
| 7,022,530 B2 | | 4/2006 | Morita et al. | |
| 7,051,205 B1 | | 5/2006 | Horiguchi et al. | |
| 7,119,662 B1 | | 10/2006 | Horiguchi et al. | |

(Continued)

FOREIGN PATENT DOCUMENTS
EP　　1437683　　7/2004
(Continued)

OTHER PUBLICATIONS

International Search Report (Application No. PCT/JP2006/301705) Dated May 16, 2006.

(Continued)

*Primary Examiner* — Pho M Luu
(74) *Attorney, Agent, or Firm* — Eric J. Robinson; Robinson Intellectual Property Law Office, P.C.

(57) ABSTRACT

It is an object of the present invention to provide an involatile memory device, in which additional writing of data is possible other than in manufacturing steps and forgery and the like due to rewriting can be prevented, and a semiconductor device having the memory device. It is also an object of the present invention to provide an inexpensive involatile memory device and a semiconductor device having high reliability. According to the present invention, a memory device includes a first conductive layer, a second conductive layer, and an insulating layer interposed between the first conductive layer and the second conductive layer, where the first conductive layer has a convex portion.

42 Claims, 16 Drawing Sheets

U.S. PATENT DOCUMENTS

| | | |
|---|---|---|
| 7,159,241 B1 | 1/2007 | Horiguchi et al. |
| 7,170,110 B2 | 1/2007 | Inoue et al. |
| 7,323,715 B2 * | 1/2008 | Yamazaki ............... 257/59 |
| 7,338,859 B2 * | 3/2008 | Park ............... 438/257 |
| 7,361,924 B2 | 4/2008 | Breuil et al. |
| 7,518,692 B2 | 4/2009 | Yamazaki et al. |
| 2002/0182837 A1 | 12/2002 | Daubenspeck et al. |
| 2003/0081446 A1 | 5/2003 | Fricke et al. |
| 2003/0156449 A1 | 8/2003 | Ooishi |
| 2003/0161175 A1 | 8/2003 | Fricke et al. |
| 2003/0227793 A1 | 12/2003 | Tsujioka |
| 2004/0183647 A1 | 9/2004 | Arai et al. |
| 2004/0184331 A1 | 9/2004 | Hanzawa et al. |
| 2006/0280010 A1 | 12/2006 | Hanzawa et al. |
| 2008/0149733 A1 | 6/2008 | Yukawa et al. |
| 2008/0206931 A1 | 8/2008 | Breuil et al. |

FOREIGN PATENT DOCUMENTS

| | | |
|---|---|---|
| JP | 04-042960 | 2/1992 |
| JP | 05-012726 | 1/1993 |
| JP | 2001-189431 | 7/2001 |
| JP | 2002-026277 | 1/2002 |
| JP | 2004-220591 | 8/2004 |
| WO | WO-2004/017436 | 2/2004 |

OTHER PUBLICATIONS

Written Opinion (Application No. PCT/JP2006/301705) Dated May 16, 2006.

* cited by examiner

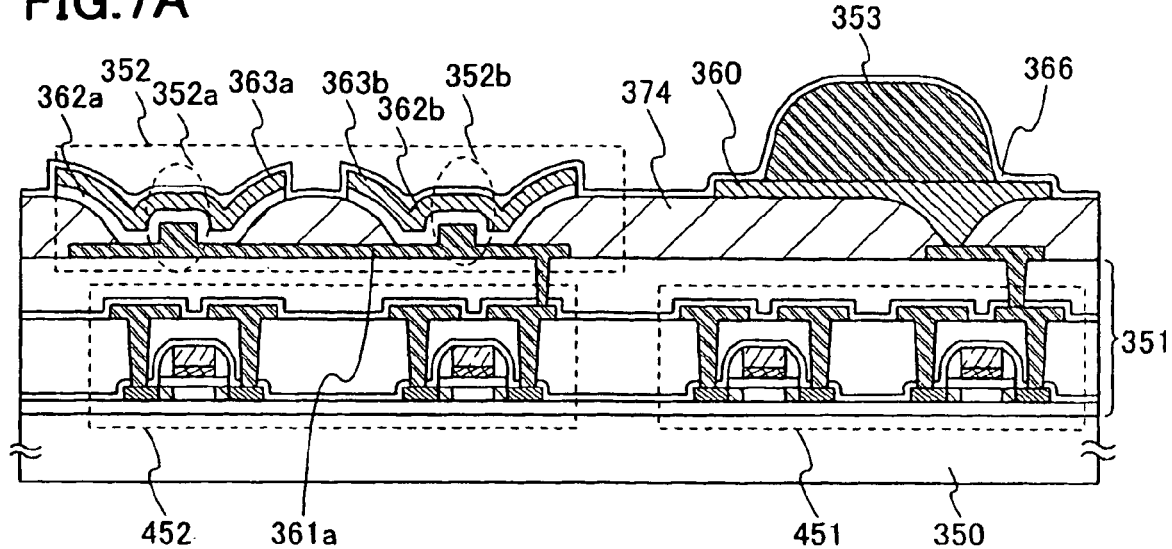
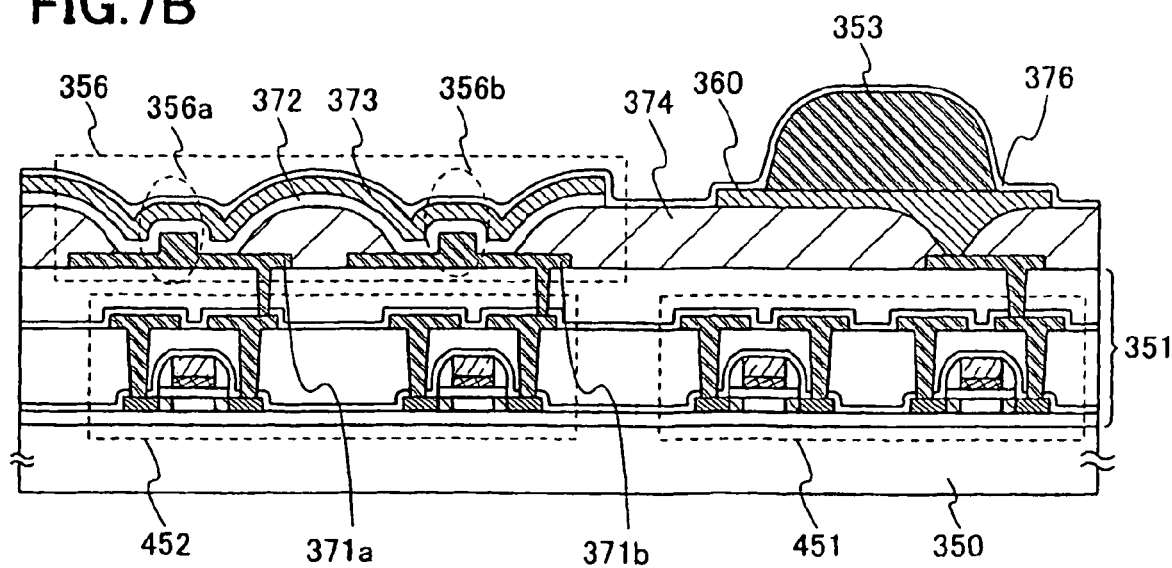

F=Floating

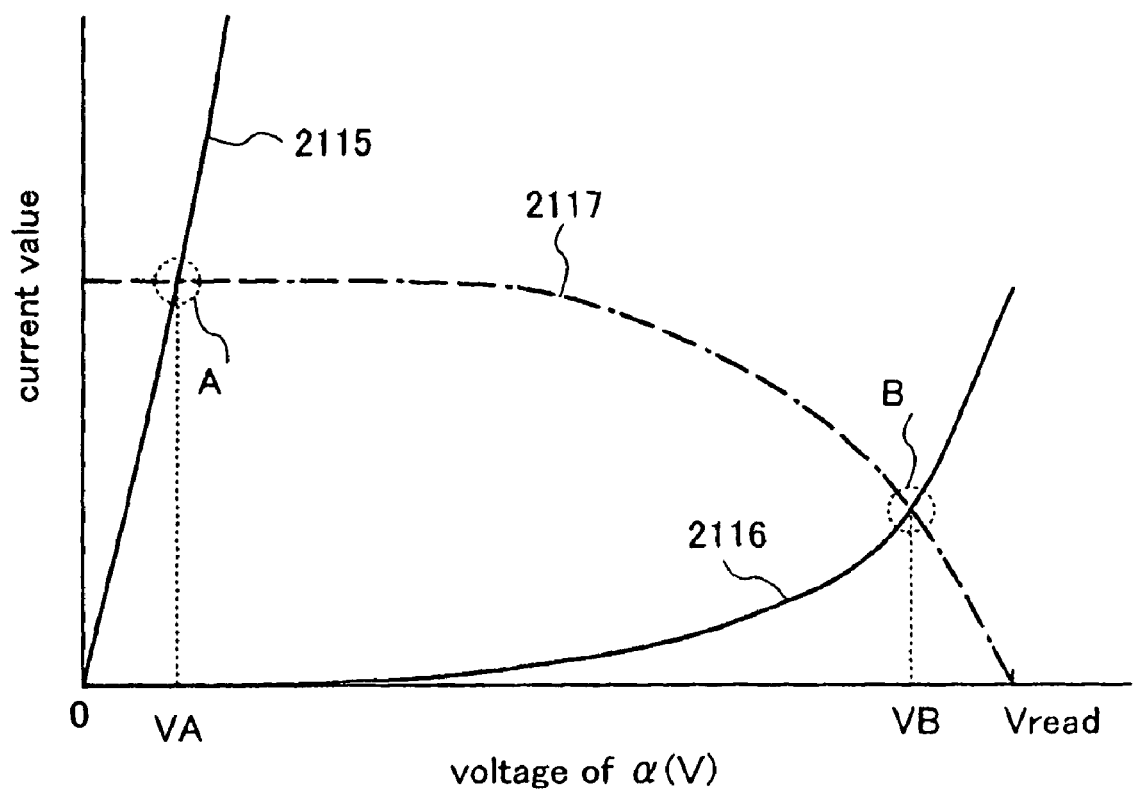

MEMORY DEVICE AND SEMICONDUCTOR DEVICE

TECHNICAL FIELD

The present invention relates to a memory device and a semiconductor device provided with the memory device.

BACKGROUND ART

In recent years, a semiconductor device having a plurality of circuits integrated over an insulated surface and various functions has been developed. Further, development of a semiconductor device capable of wireless data transmission/reception by providing an antenna has been advanced. Such a semiconductor device is referred to as a wireless chip (also referred to as an ID tag, an IC tag, an IC chip, an RF (Radio Frequency) tag, a wireless tag, an electronic tag, and an RFID (Radio Frequency Identification) tag), and is already introduced to a part of the market.

Many of these semiconductor devices that have already been put into practical use have a circuit using a semiconductor substrate such as a Si substrate (also referred to as an IC (Integrated Circuit) chip) and an antenna, and the IC chip includes a memory circuit (also referred to as a memory), a control circuit and the like. In particular, by providing a memory circuit which can store much data, a high-value-added semiconductor device providing higher performance can be provided. In addition, such semiconductor devices are required to be manufactured at a low cost. In recent years, an organic TFT, an organic memory and the like using an organic compound for a control circuit, a memory circuit and the like have been actively developed (Reference 1: Japanese Patent Application Laid-Open No. 2002-26277).

As a memory circuit, a DRAM (Dynamic Random Access Memory), an SRAM (Static Random Access Memory), an FeRAM (Ferroelectric Random Access Memory), a mask ROM (Read Only Memory), an EPROM (Electrically Programmable Read Only Memory), an EEPROM (Electrically Erasable and Programmable Read Only Memory), a flash memory and the like are given. Among them, a DRAM and an SRAM are volatile memory circuits in which data is erased when the power is turned off so that it is necessary to write data every time the power is turned on. An FeRAM is an involatile memory circuit and uses a capacitor element including a ferroelectric layer so that manufacturing steps thereof are increased. A mask ROM has a simple structure, however, data is required to be written during the manufacturing steps and cannot be additionally written. An EPROM, an EEPROM, and a flash memory are involatile memory circuits; however, an element having two gate electrodes are used, and thus, the manufacturing steps are increased.

On the other hand, a memory circuit using an organic compound is formed by using a memory element in which an organic compound is provided between a pair of electrodes. When a thickness of the organic compound layer is made thick, a current does not easily flow so that a drive voltage for writing and reading is increased.

In view of the foregoing problems, it is an object of the present invention to provide an involatile memory device, in which additional writing is possible other than in manufacturing steps and forgery and the like due to rewriting can be prevented, and a semiconductor device having the memory device. It is also an object of the present invention to provide an inexpensive involatile memory device and semiconductor device consuming low power.

DISCLOSURE OF INVENTION

According to the present invention, a memory device includes a first conductive layer, a second conductive layer, and an insulating layer interposed between the first conductive layer and the second conductive layer; where the first conductive layer has a convex portion.

In addition, according to the present invention, a memory device includes a memory cell array in which memory cells are arranged in a matrix and a writing circuit; where the memory cell has a memory element; the memory element has a first conductive layer, a second conductive layer, and an insulating layer interposed between the first conductive layer and the second conductive layer; and the first conductive layer has a convex portion.

In addition, according to the present invention, a memory device includes a memory cell array in which memory cells are arranged in a matrix and a writing circuit; where the memory cell has a transistor and a memory element; the memory element has a first conductive layer, a second conductive layer, and an insulating layer interposed between the first conductive layer and the second conductive layer; and the first conductive layer has a convex portion.

In addition, according to the present invention, a semiconductor device includes a first transistor, a second transistor, a memory element connected to a conductive layer functioning as a source wiring or a drain wiring of the first transistor, and an antenna connected to a conductive layer functioning as a source wiring or a drain wiring of the second transistor; where the memory element has a conductive layer having a convex portion, a second conductive layer, and an insulating layer interposed between the first conductive layer and the second conductive layer.

It is to be noted that the first transistor and the memory element are connected to each other through a conductive fine particle. In addition, the second transistor and the antenna are connected to each other through a conductive fine particle.

In addition, the first conductive layer and the second conductive layer, which become a pair, are partly connected, and at least a part of the convex portion has a curved surface. Alternatively, the convex portion has a region, in which a sidewall face thereof is inclined at an angle of 10 degrees or more to 85 degrees or less with respect to the surface of the first conductive layer. In addition, a liquid-repellent layer may be provided over the surface of the convex portion. Further, a plurality of convex portions may be provided over the first conductive layer.

In addition, in the memory element, the resistance value is changed by an optical action. In such a memory element, an insulating layer is formed by using a conjugated polymer material doped with a photoacid generator.

In addition, in the memory element, the resistance value is changed by an electric action. In such a memory element, an insulating layer is formed by using an organic compound, typically, an organic insulator, an electron-transport material or a hole-transport material. Moreover, the insulating layer is formed by using an inorganic insulator.

In addition, the first conductive layer and the second conductive layer, which become a pair, are partly connected.

In addition, the memory cell array and the writing circuit are provided over a glass substrate or a flexible substrate. Typically, the writing circuit is formed by using a thin film transistor.

In addition, the memory cell array and the writing circuit are provided over a single crystal semiconductor substrate. Typically, the writing circuit is formed by using a field effect transistor.

In addition, a semiconductor device according to the present invention having the structure as described above includes one or a plurality of circuits selected from a power supply circuit, a clock generating circuit, a data demodulation/modulation circuit, a control circuit or an interface circuit.

In accordance with the present invention, a semiconductor device can be obtained, in which writing of data (additional writing) is possible other than in manufacturing steps and forgery due to rewriting can be prevented. In addition, a memory element is formed by using a conductive layer having a convex portion; and thus, a drive voltage at a time for writing of data can be reduced. As a result, a memory device and a semiconductor device consuming low power can be provided. Further, a semiconductor device according to the present invention includes a memory element having a simple structure in which an insulating layer is interposed between a pair of conductive layers; and thus, an inexpensive semiconductor device can be provided. In addition, the memory element has a simple structure, and can be more highly-integrated; and thus, a semiconductor device having a large-capacity memory circuit can be provided.

BRIEF DESCRIPTION OF DRAWINGS

In the accompanying drawings:

FIGS. 7A and 7B are cross-sectional views illustrating a semiconductor device according to the present invention.

FIG. 14 is a diagram describing current voltage characteristics of a memory element and a resistive element.

BEST MODE FOR CARRYING OUT THE INVENTION

Figure 1A:
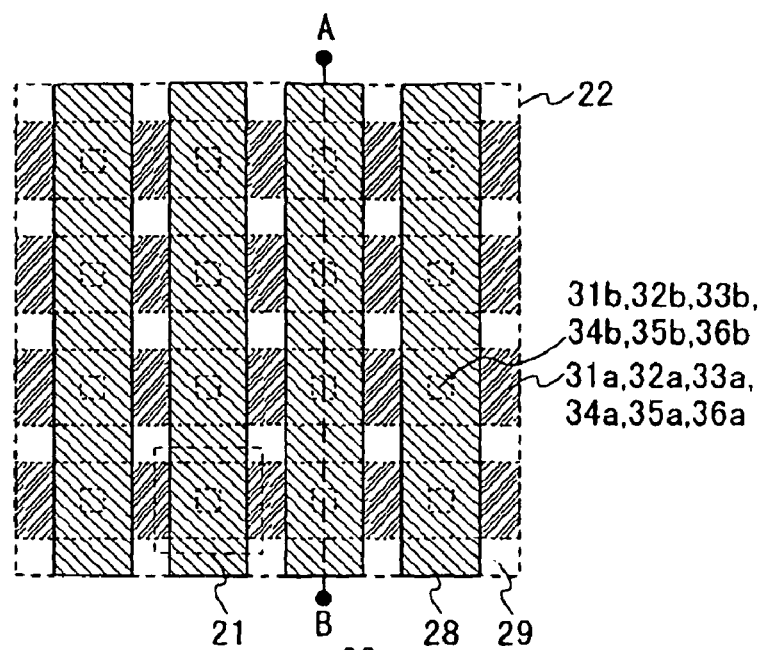
FIG. 1A is a top view and FIGS. 1B to 1E are cross-sectional views illustrating a memory device according to the present invention.

Embodiment Modes of the present invention will be described with reference to accompanying drawings. It is to be noted that the present invention is not limited to the following description, and various changes and modifications in the Embodiment Modes and its details will be apparent to those skilled in the art unless such changes and modifications depart from the spirit and scope of the invention. Therefore, the present invention should not be interpreted as being limited to the Embodiment Modes described hereinafter. It is to be noted that the same parts are denoted by the same reference numerals in different drawings in the structure of the present invention to be described hereinafter.

Embodiment Mode 1

In the present embodiment mode, a structural example of a memory element of a memory device according to the present invention will be described with reference to the accompanying drawings. More specifically, a case where a structure of a memory device is a passive matrix type will be described.

Figure 1B:
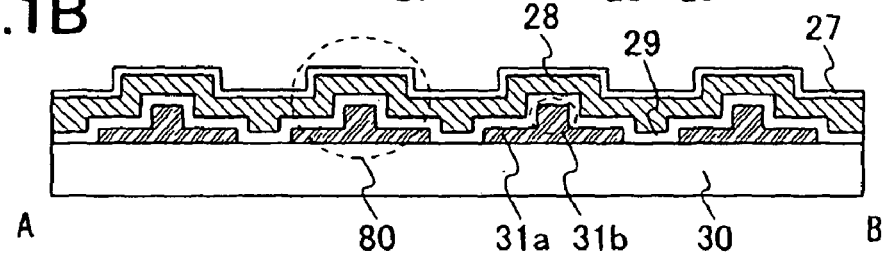

FIG. 1A shows a planar structure of a memory cell array 22 of a memory device according to the present invention, and FIG. 1B shows a cross-sectional structure along A-B of FIG. 1A. The memory cell array 22 includes, over a substrate 30 having an insulated surface, a first conductive layer 31a extended in a first direction, an insulating layer 29 provided to cover the first conductive layer 31a, and a second conductive layer 28 extended in a second direction that is a perpendicular direction to the first direction. In addition, the first conductive layer 31a includes a convex portion 31b for each memory cell. Further, a memory element 80 is formed by a stacked structure of the first conductive layer 31a, the insulating layer 29 and the second conductive layer 28: In addition, an insulating layer 27 functioning as a protective film is provided to cover the second conductive layer 28 here (refer to FIG. 1B).

A highly-conductive element, compound or the like is used for a material of the first conductive layer 31a and the second conductive layer 28. A substance in which a crystal state, conductivity or a shape is changed by an electric action or an optical action is used for a material of the insulating layer 29. In a memory element having the structure as described above, conductivity is changed before and after applying a voltage; and thus, the memory element can store two values corresponding to "initial state" and "state after conductivity change". Hereinafter, a change in conductivity of the memory element before and after applying a voltage will be described.

Figure 2A:
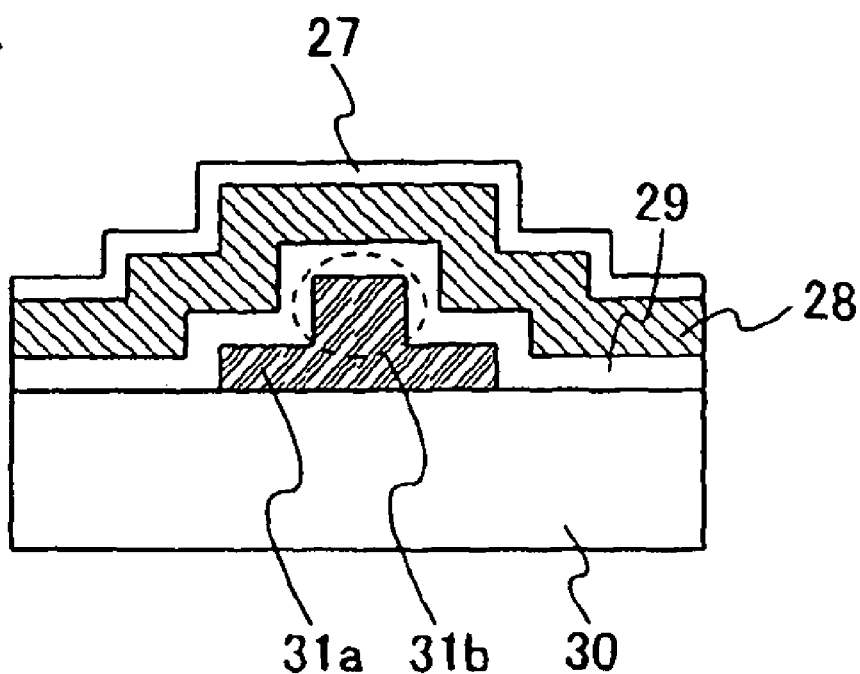
FIGS. 2A and 2B are cross-sectional views illustrating a memory device according to the present invention.
Figure 2B:
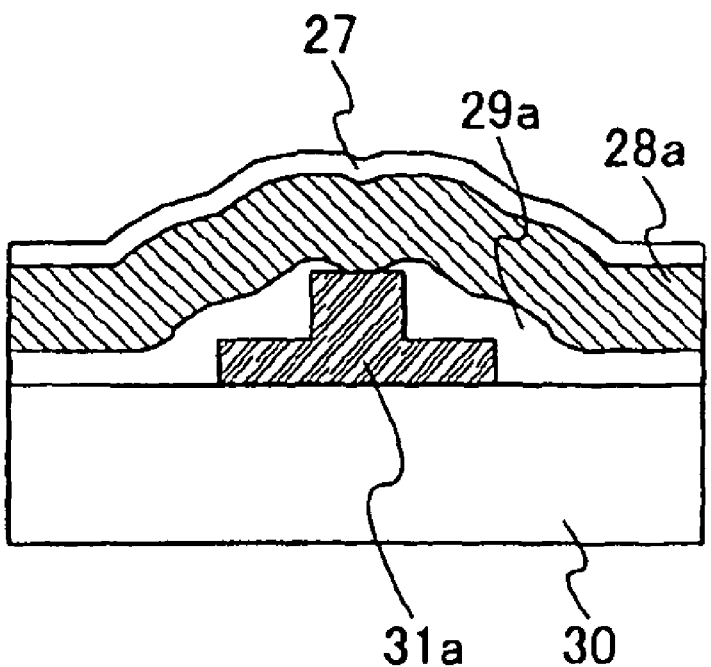

When a voltage is applied between the first conductive layer 31a and the second conductive layer 28, the first conductive layer 31a and the second conductive layer 28 are short-circuited, and conductivity of the memory element becomes higher. In other words, when a voltage is applied, a current flows into the insulating layer 29 to generate heat. Then, when a temperature of the insulating layer is increased to a glass transition point, the insulating layer has liquidity to make a film thickness uneven. Conductivity of a portion in which a film thickness has become thin is particularly high so that the first conductive layer 31a and the second conductive layer 28 are short-circuited, and conductivity of the memory element is increased. In this case, since the first conductive layer 31a has the convex portion 31b, the insulating layer having liquidity is easily moved in the convex portion (refer to FIG. 2A). As a result, the insulating layer and the second conductive layer are transformed, and the first conductive layer 31a and the second conductive layer 28a are short-circuited.

In addition, when a voltage is applied between the first conductive layer 31a and the second conductive layer 28, a dielectric breakdown is generated in the insulating layer 29, and conductivity may be observed. This is because an electric field is likely to be concentrated in a corner of the convex portion in the first conductive layer 31a, and a dielectric breakdown is easily generated in the insulating layer 29.

Accordingly, writing can be performed by low power consumption.

It is to be noted that a convex portion here is a region (a protrusion) protruding through the surface of the first conductive layer 31a. That is to say, it is a region having a height difference between a surface of the first conductive layer 31a and a top of the convex portion.

The height of the convex portion protruding through the surface of the first conductive layer 31a (a height difference between the surface of the first conductive layer 31a and the top of the convex portion) is 5 to 500 nm, preferably, 20 to 300 nm, by measuring with the use of SEM (Scanning Electron Microscope), TEM (Transmission Electron Microscope), a stylus surface profiler or the like. When the height of the convex portion is lower than the above range, and further, concavity and convexity are formed on the surface of the first conductive layer 31a, the convex portion gets mixed with the concavity and convexity, and does not serve as a convex portion so that it becomes difficult to conduct writing by low power consumption. In addition, when the height of the convex portion is higher than the above range, coverage of the insulating layer 29 formed over the first conductive layer 31a is lowered, and a region in which the first conductive layer 31a is not covered with the insulating layer 29 is formed. As a result, there rises a problem that the first conductive layer 31a and the second conductive layer 28 are short-circuited to lower the yield.

It is to be noted that the surface of the first conductive layer 31a is a surface of a region in which evenness in film thickness is high in the first conductive layer 31a.

Figure 1C:
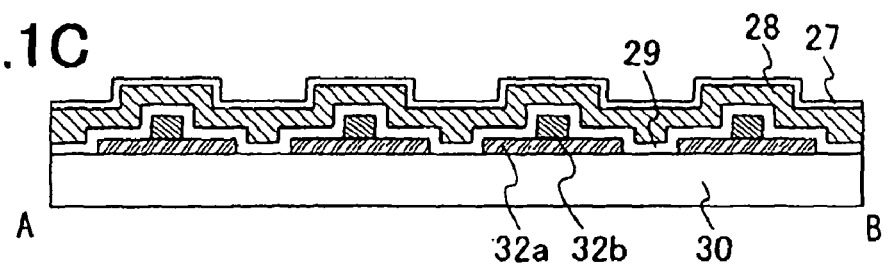

As a first conductive layer which can conduct writing as described above, conductive layers with different etching rates are stacked, and etching is conducted under the condition where an area of an upper layer is smaller than an area of a lower layer. Accordingly, a first conductive layer 32a having a convex portion 32b can be formed (refer to FIG. 1C).

Figure 1D:
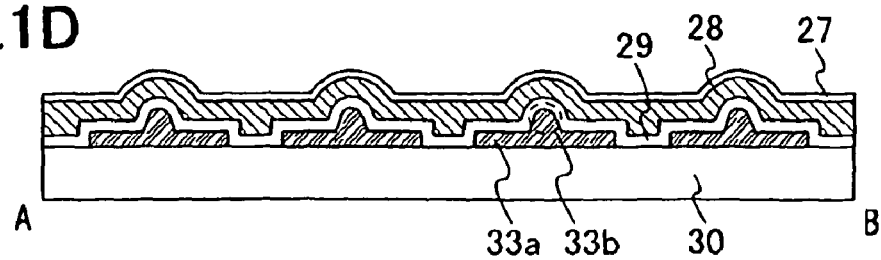

In addition, by using a droplet discharge method, a first conductive layer 33a having a convex portion 33b with curvature (curved surface, curved shape) can be formed (refer to FIG. 1D).

Figure 1E:
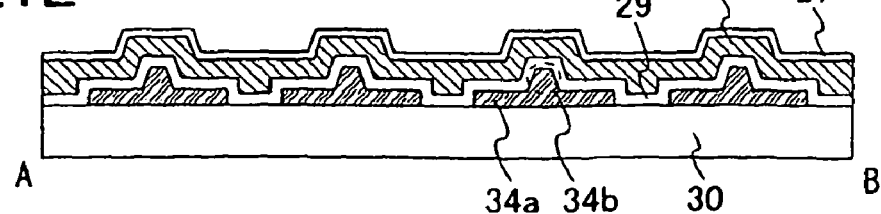

In addition, by an etching condition, a first conductive layer 34a having a convex portion 34b with a forward taper can be formed (refer to FIG. 1E). It is to be noted that the forward taper here is a region in which a sidewall face of the convex portion 34b is inclined to a surface of the first conductive layer. The inclined angle is 10 degrees or more to 85 degrees or less, preferably, 60 degrees or more to 80 degrees or less. In addition, a top of the convex portion 34b has an angular shape.

Figure 3A:
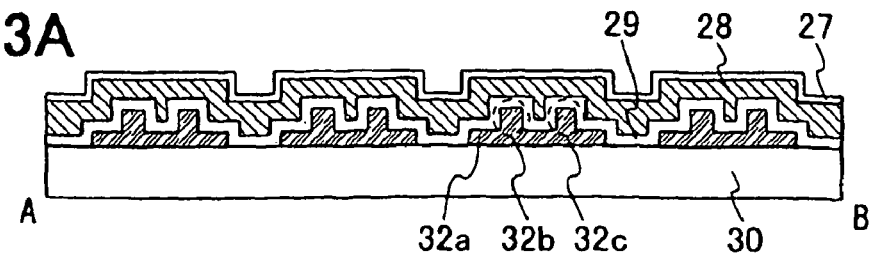
FIGS. 3A to 3F are cross-sectional views illustrating a memory device according to the present invention.

Further, the first conductive layer may have a plurality of convex portions having the shape as described. In FIG. 3A, a first conductive layer 32a having a plurality of convex portions 32b and 32c is shown.

Figure 16A:
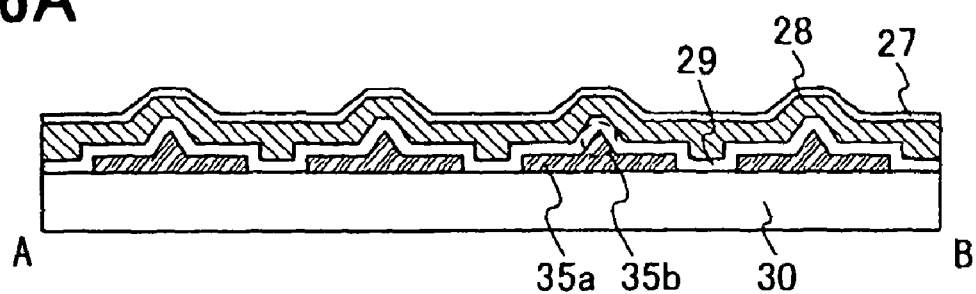
FIGS. 16A and 16B are cross-sectional views illustrating a memory device according to the present invention.

Moreover, a top of a convex portion 35a may have a pointed head shape as shown in FIG. 16A.

Figure 16B:
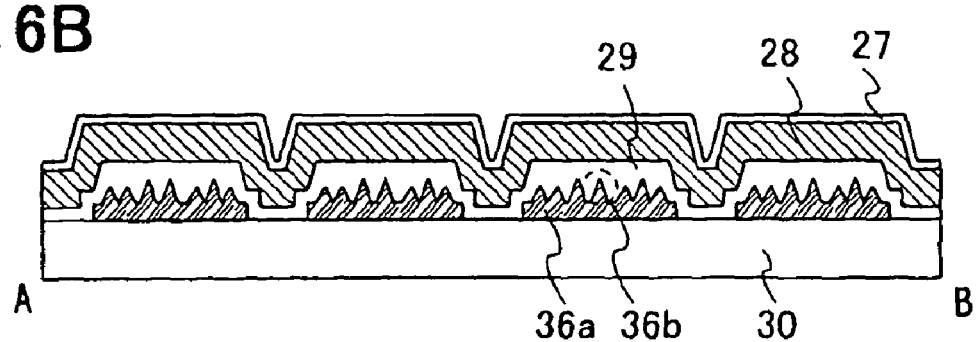

Further, as shown in FIG. 16B, a first conductive layer 36a may have a plurality of convex portions 36b having a top of a pointed head shape.

Figure 3B:
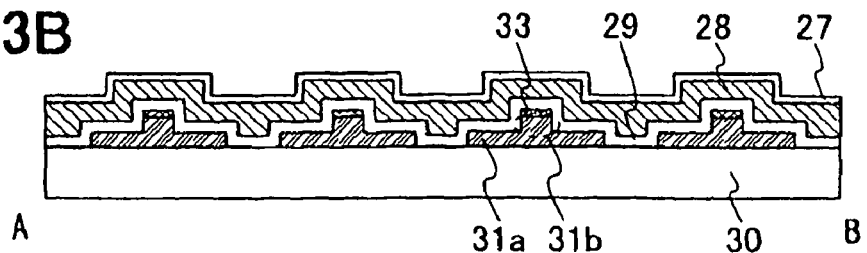

In addition, a liquid-repellent layer 33 may be provided over the surface of the convex portion 31b of the first conductive layer 31a (refer to FIG. 3B). Here, the liquid-repellent layer is a layer which can easily shed the insulating layer 29 when the insulating layer 29 has liquidity at a temperature equal to or more than a glass transition point. In FIG. 3B, the liquid-repellent layer 33 is provided on the top of the convex portion 31b of the first conductive layer 31a.

Figure 3C:
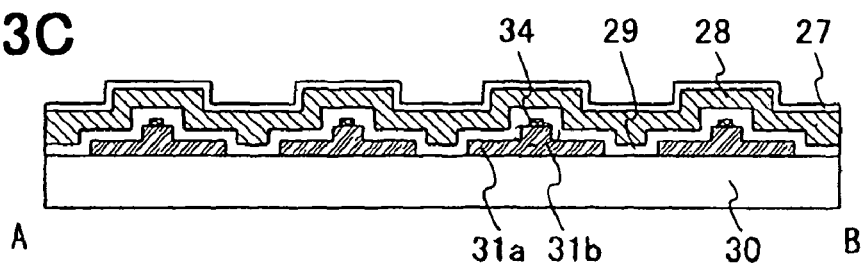

In addition, a liquid-repellent layer 34 may be provided over a part of the convex portion 31b of the first conductive layer 31a (refer to FIG. 3C).

Figure 3D:
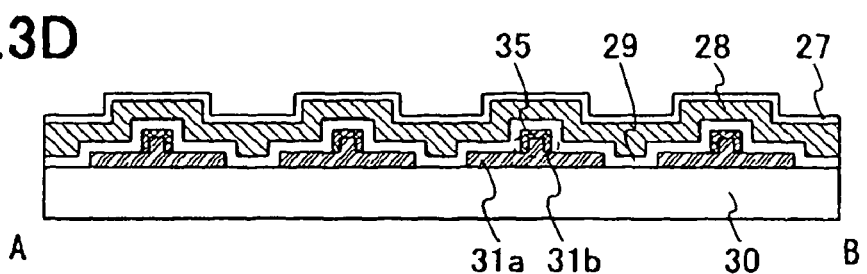

Further, a liquid-repellent layer 35 may be provided over the entire surface of the convex portion 31b of the first conductive layer 31a. Specifically, the liquid-repellent layer 35 may be provided over the side face and the top of the convex portion 31b (refer to FIG. 3D).

As a method for forming a liquid-repellent layer, a method is given, in which a material, which can easily shed an insulating layer when a material for the insulating layer has liquidity at a temperature equal to or more than a glass transition point, is applied to a predetermined area by a droplet discharge method, printing or the like and then baked. In addition, a method is also given, in which the material as described above is adsorbed over the first conductive layer and the substrate, and a region where a liquid-repellent layer is not formed is irradiated with ultra-violet ray or the like by using a photomask to decompose the material and form a liquid-repellent layer. Further, a method is given, in which, after the material is adsorbed over the first conductive layer, a protective mask is formed over a region where a liquid-repellent layer is formed, and a region not covered with the protective mask is removed by oxygen ashing or the like, and then, the protective mask is removed to form a liquid-repellent layer.

As a typical example of the material which can easily shed the insulating layer when the material for the insulating layer has liquidity at a temperature equal to or more than a glass transition point, a compound having an alkyl group or a fluorocarbon chain is given.

In addition, an organic resin having a fluorocarbon chain (fluorine-based resin) can be used. As the fluorine-based resin, polytetrafluoroethylene (PTFE; 4-fluorinated ethylene resin); perfluoroalkoxy alkane (PFA; 4-fluorinated ethylene perfluoroalkylvinylether copolymer resin); perfluoroethylenepropene copolymer (PFEP; 4-fluorinated ethylene 6-fluorinated propylene copolymer resin); ethylene-tetrafluoroethylene copolymer (ETFE; 4-fluorinated ethylene-ethylene copolymer resin); polyvinylidene fluoride (PVDF; fluorinated vinylidene resin); polychlorotrifluoroethylene (PCTFE; 3-fluorinated ethylene chloride resin); ethylene-chlorotrifluoroethylene copolymer (ECTFE; 3-fluorinated ethylene chloride-ethylene copolymer resin); polytetrafluoroethylene-perfluorodioxole copolymer (TFE/PDD); polyvinyl fluoride (PVF; fluorinated vinyl resin), or the like can be used.

In addition, organic silane represented by a chemical formula: $Rn—Si—X_{(4-n)}$ (n=1, 2, 3) can also be used. In this formula, R represents a group that is comparatively inactive, such as a fluoro alkyl group or an alkyl group. Further, X represents a hydrolytic group capable of coupling by condensation polymerization with the hydroxyl group on the surface of a substrate, such as halogen, a methoxy group, an ethoxy group or an acetoxy group.

As an example of organic silane, fluoroalkylsilane (hereinafter referred to as FAS) having a fluoroalkyl group as R may be used. R of FAS has a structure represented by $(CF_3)(CF_2)_x(CH_2)_y$, where x is an integer that is 0 or more to 10 or less and y is an integer that is 0 or more to 4 or less. When a plurality of R or X are coupled with Si, all of the R or X may be the same or different. As a typical example of FAS, fluoroalkylsilane (FAS) such as heptadecafluorotetrahydrodecyltriethoxysilane, heptadecafluorotetrahydrodecyltrichlorosilane, tridecafluorotetrahydrooctyltrichlorosilane, or trifluoropropyltrimethoxysilane is given.

As another example of organic silane, alkoxysilane having an alkyl group as R may be used. As alkoxysilane, alkoxysilane having 2 to 30 carbon atoms is preferably used. As typical examples, ethyltriethoxysilane, propyltriethoxysilane, octyltriethoxysilane, decyltriethoxysilane, octadecyltriethoxysilane (ODS); eicosyltriethoxysilane, and triacontyltriethoxysilane are given.

Further, as a material which can easily shed the insulating layer when the material for the insulating layer has liquidity at a temperature equal to or more than a glass transition point, a material can be appropriately used, which has a contact angle that is different by 30 degrees or more, preferably 40 degrees or more, from a contact angle of the material for the insulating layer at a temperature equal to or more than a glass transition point.

Figure 3E:
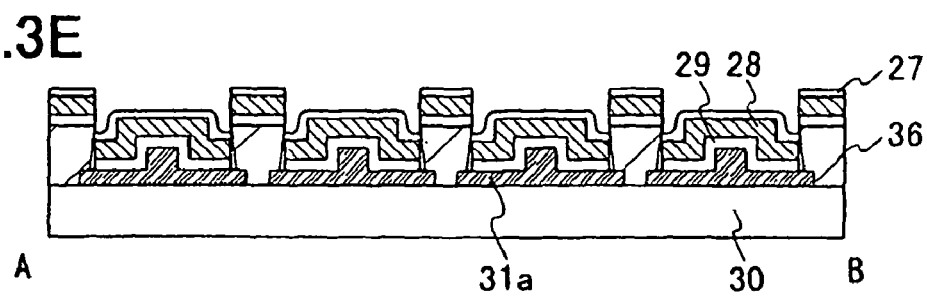

When an influence of an electric field in a lateral direction is concerned in each interval of adjacent memory cells, an insulating layer 36 (also referred to as a partition) may be provided for each memory cell to isolate the insulating layer provided in each memory cell (refer to FIG. 3E). In other words, a structure may be adopted, in which the insulating layer 36 is selectively formed in each memory cell. Since the insulating layer 36 is provided to have a reverse taper shape, the insulating layer 29 and the second conductive layer 28 formed subsequently can be formed in each memory cell, which is preferable. Thereafter, the insulating layer 29 and the second conductive layer 28 are formed to cover the first conductive layer 31a and the insulating layer 36.

Figure 3F:
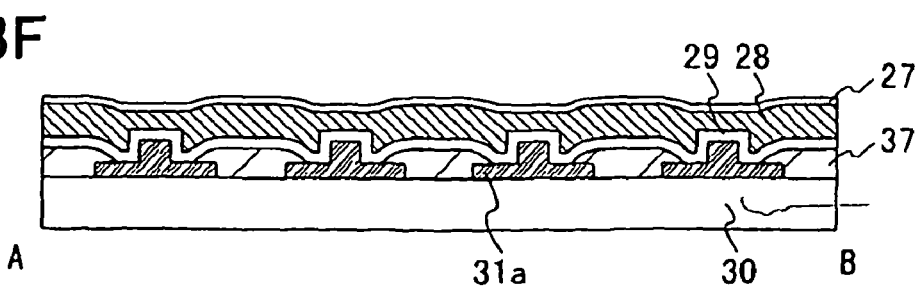

In addition, when the insulating layer 29 is formed to cover the first conductive layer 31a, an insulating layer 37 (also referred to as a partition) may be provided between the first conductive layers 31a in order to prevent disconnection of the insulating layer 29 caused by a step in an end portion of the first conductive layer 31a or an influence of an electric field in a lateral direction in each memory cell interval (refer to FIG. 3F). It is to be noted that the insulating layer 37 preferably has a forward taper shape, more preferably, a curved shape. Then, the insulating layer 29 and the second conductive layer 28 are formed to cover the first conductive layer 31a and the insulating layer 37.

In the structure of the memory cell, as a substrate 30, a quartz substrate, a silicon substrate, a metal substrate, a stainless substrate or the like can be used in addition to a glass substrate and a flexible substrate. The flexible substrate is a substrate which can be bent (flexible) such as a plastic substrate composed of polycarbonate, polyarylate, polyethersulfone or the like. In addition, a laminate film (composed of polypropylene, polyester, vinyl, polyvinyl fluoride, vinyl chloride or the like), paper made of a fibrous material, or the like can also be used. In addition, the memory cell array 22 can be provided above a field effect transistor (FET) formed over a semiconductor substrate such as Si, GaN, GaAs, or InP, or above a thin film transistor (TFT (Thin Film Transistor)) formed over a substrate such as glass.

In addition, a highly-conductive element, compound or the like is used for the first conductive layers 31a to 34a and the second conductive layer 28. As a typical example, a single-layer or stacked layer structure composed of an alloy containing an element selected from gold (Au), silver (Ag), platinum (Pt), nickel (Ni), tungsten (W), chrome (Cr), molybdenum (Mo), iron (Fe), cobalt (Co), copper (Cu), palladium (Pd), carbon (C), aluminum (Al), manganese (Mn), titanium (Ti), or tantalum (Ta); or a plurality of the elements can be used. As the alloy containing a plurality of the elements, for example, an alloy containing Al and Ti, an alloy containing Al, Ti and C, an alloy containing Al and Ni, an alloy containing Al and C, an alloy containing Al, Ni and C, an alloy containing Al and Mo, or the like can be used.

As for the first conductive layers 31a to 34a, after a conductive layer is formed by using evaporation, sputtering, CVD, printing, electro plating, electroless plating, or the like, a part thereof is etched to form the first conductive layers 31a to 34a having the convex portions 31b to 34b and 32c (refer to FIG. 1B).

The second conductive layer 28 can be formed by using evaporation, sputtering, CVD, printing, or a droplet discharge method. In addition, the second conductive layer 28 may also have the convex portions 31b to 34b as in FIGS. 1B to 1E. Here, any of the methods is used to form the first conductive layers 31a to 34a, and the second conductive layer 28. In addition, different methods may be used to form the first conductive layers 31a to 34, and the second conductive layer 28, respectively.

In the present embodiment mode, writing of data to a memory cell is conducted by applying an electric action or optical action. When writing of data is conducted by an optical action, one or both of the first conductive layers 31a to 34a and the second conductive layer 28 are provided to be light-transmitting. Either a light-transmitting conductive layer is formed by using a transparent conductive material, or, the light-transmitting conductive layer is formed to have a thickness so as to transmit light even when a transparent conductive material is not used. As a transparent conductive material, indium tin oxide (ITO), zinc oxide (ZnO), indium zinc oxide (IZO), zinc oxide doped with gallium (GZO), or other conductive light-transmitting oxide material can be used. ITO, indium tin oxide containing silicon oxide, indium oxide containing silicon oxide further mixed with 2 to 20% of zinc oxide (ZnO) may also be used.

The insulating layer 29 is formed by an organic insulator, an organic compound in which conductivity is changed by an electric action or an optical action, an inorganic insulator, or a layer in which an organic compound and an inorganic compound are mixed. The insulating layer 29 may be provided as a single-layer or a stacked layer of plural layers. In addition, a mixed layer of an organic compound and an inorganic compound, and a layer composed of an organic compound in which conductivity is changed by an electric action or an optical action may be stacked.

As an inorganic insulator which can compose the insulating layer 29, silicon oxide, silicon nitride, silicon oxynitride, silicon nitride oxide or the like can be used.

In addition, as an organic insulator which can compose the insulating layer 29, an organic resin typified by polyimide, acryl, polyamide, benzocyclobutene, epoxy or the like can be used.

In addition, an organic compound, which can compose the insulating layer 29, and in which conductivity is changed by an electric action or an optical action, an organic compound material having a high hole-transport property or an organic compound material having a high electron-transport property can be used.

As an organic compound material having a high hole-transport property, an aromatic amine compound (namely, a compound having a bond of benzene ring-nitrogen) such as 4,4'-bis(N-[1-naphthyl]-N-phenyl-amino)-biphenyl (abbreviation: α-NPD); 4,4'-bis(N-[3-methylphenyl]-N-phenylamino)-biphenyl (abbreviation: TPD); 4,4',4''-tris(N,N-diphenyl-amino)-triphenylamine (abbreviation: TDATA); 4,4',4''-tris(N-[3-methylphenyl]-N-phenyl-amino)-triphenylamine (abbreviation: MTDATA); or 4,4'-bis(N-(4-[N,N-di-m-tolylamino]phenyl)-N-phenylamino)biphenyl (abbreviation: DNTPD), or a phthalocyanine compound such as phthalocyanine (abbreviation: $H_2Pc$); copper phthalocyanine (abbreviation: CuPc), or vanadyl phthalocyanine (abbreviation: VOPc) can be used. The substance as described above is mainly a substance having hole-mobility equal to or more than $10^{-6}$ cm$^2$/Vs. However, a substance other than the substances as described above may also be used as far as a hole-transport property is higher than an electron-transport property.

When a mixed layer of an organic compound and an inorganic compound is provided, it is preferable to mix an organic compound material having a high hole-transport property and an inorganic compound material which can easily receive an electron. By such a structure, in the organic compound which includes originally almost no innate carriers, many hole-carriers are generated, and a very favorable hole-injecting and -transport property can be obtained. As a result, the organic compound layer can have favorable conductivity.

As the inorganic compound material which can easily receive an electron, metal oxide, metal nitride or metal oxynitride of a transition metal that belongs any of Groups 4 to 12 of the periodic table can be used. Specifically, titanium oxide ($TiO_x$); zirconium oxide ($ZrO_x$), vanadium oxide ($VO_x$), molybdenum oxide ($MoO_x$), tungsten oxide ($WO_x$), tantalum oxide ($TaO_x$), hafnium oxide ($HfO_x$), niobium oxide ($NbO_x$), cobalt oxide ($CO_x$), rhenium oxide ($ReO_x$), ruthenium oxide ($RuO_x$), zinc oxide (ZnO), nickel oxide ($NiO_x$), copper oxide ($CuO_x$), or the like can be used. In addition, oxide is given as a typical example here, but nitride and oxynitride of these metals may also be used as a matter of course.

As the organic compound material having a high electron-transport property, a material composed of a metal complex having a quinoline skeleton or benzoquinoline skeleton such as tris(8-quinolinolato)aluminum (abbreviation: $Alq_3$); tris(4-methyl-8-quinolinolato)aluminum (abbreviation: $Almq_3$); bis (10-hydroxybenzo[h]-quinolinato)beryllium (abbreviation: $BeBq_2$); or bis (2-methyl-8-quinolinolato)(4-phenylphenolato)aluminum (abbreviation: BAlq) or the like can be used. In addition, a metal complex material having an oxazole ligand or a thiazole ligand such as bis[2-(2-hydroxyphenyl)benzooxazolate]zinc (abbreviation: $Zn(BOX)_2$); or bis[2-(2-hydroxyphenyl)benzothiazolate]zinc (abbreviation: $Zn(BTZ)_2$) can also be used. Further, in addition to the metal complex, 2-(4-biphenyl)-5-(4-tert-butylphenyl)-1,3,4-oxadiazole (abbreviation: PBD); 1,3-bis[5-(p-tert-butylphenyl)-1,3,4-oxadiazole-2-yl]benzene (abbreviation: OXD-7); 3-(4-tert-butylphenyl)-4-phenyl-5-(4-biphenylyl)-1,2,4-triazole (abbreviation: TAZ); 3-(4-tert-butylphenyl)-4-(4-ethylphenyl)-5-(4-biphenylyl)-1,2,4-triazole (abbreviation: p-EtTAZ); bathophenanthroline (abbreviation: BPhen); bathocuproin (abbreviation: BCP) or the like can be used. The substance as described here is a substance having electron-mobility equal to or more than $10^{-6}$ cm$^2$/Vs. However, a substance other than the substances as described above may also be used as far as an electron-transport property is higher than a hole-transport property.

When a mixed layer of an organic compound and an inorganic compound is provided, it is preferable to mix an organic compound material having a high electron-transport property and an inorganic compound material which can easily supply an electron. By such a structure, in the organic compound which includes originally almost no innate carriers, many electron carriers are generated, and a very favorable electron-injecting and -transport property can be obtained. As a result, the organic compound layer can have favorable conductivity.

As the inorganic compound material which can easily supply an electron, alkali metal oxide, alkaline earth metal oxide, rare-earth metal oxide, alkali metal nitride, alkaline earth metal nitride, or rare-earth metal nitride can be used. Specifically, lithium oxide ($LiO_x$), strontium oxide ($SrO_x$), barium oxide (BaO), erbium oxide ($ErO_x$), sodium oxide ($NaO_x$), lithium nitride ($LiN_x$), magnesium nitride ($MgN_x$), calcium nitride ($CaN_x$), yttrium nitride ($YN_x$), lanthanum nitride ($LaN_x$) or the like can be used.

Besides, as the inorganic compound material, any inorganic compound material which can easily receive an electron from an organic compound, or any inorganic compound material which can easily supply an electron to an organic compound may be used. In addition to aluminum oxide ($AlO_x$), gallium oxide ($GaO_x$), silicon oxide ($SiO_x$), germanium oxide ($GeO_x$), indium tin oxide (ITO) or the like, various metal oxide, metal nitride or metal oxynitride can be used.

In addition, when the insulating layer 29 is formed by using a compound selected from metal oxide or metal nitride and a compound having a high hole-transport property, a structure may be employed, in which a compound having large steric hindrance (it is different from a planar structure, and has a spatial spread) is added. As a compound having large steric hindrance, 5,6,11,12-tetraphenyltetracene (abbreviation: rubrene) is preferably used. Alternatively, hexaphenylbenzene, t-butylperylene, 9,10-di(phenyl)anthracene, coumalin 545T or the like can also be used. In addition, dendrimer or the like is also effective.

Moreover, between a layer composed of an organic compound material having a high electron-transport property and a layer composed of an organic compound material having a high hole-transport property, a luminescent substance such as 4-dicyanomethylene-2-methyl-6-[2-(1,1,7,7-tetramethyl-julolidine-9-yl)ethenyl]-4H-pyran (abbreviation: DCJT); 4-dicyanomethylene-2-t-butyl-6-[2-(1,1,7,7-tetramethyl-julolidine-9-yl)ethenyl]-4H-pyran; periflanthene; 2,5-dicyano-1,4-bis[2-(10-methoxy-1,1,7,7-tetramethyl-julolidine-9-yl)ethenyl]benzene; N,N'-dimethylquinacridone (abbreviation: DMQd); coumarin 6; coumarin 545T; tris(8-quinolinolato)aluminum (abbreviation: $Alq_3$); 9,9'-bianthryl; 9,10-diphenylanthracene (abbreviation: DPA); 9,10-bis(2-naphthyl)anthracene (abbreviation: DNA); or 2,5,8,11-tetra-t-butylperylene (abbreviation: TBP) may also be provided.

In addition, a material in which electric resistance is changed by an optical action can be used for the insulating layer 29. Specifically, a conjugated polymer doped with a compound, which generates acid by absorbing light (photoacid generator), can be used. As the conjugated polymer, polyacetylene, poly(phenylene vinylene), polythiophene, polyaniline, poly(phenylene ethynylene) and the like can be used. In addition, as a photoacid generator, aryl sulfonium salt, aryl iodonium salt, o-nitrobenzyl tosylate, aryl sulfonic acid p-nitrobenzyl ester, sulfonyl acetophenone, Fe-allene complex $PF_6$ salt and the like can be used.

The insulating layer 29 can be formed by using evaporation, electron beam evaporation, sputtering, CVD or the like. In addition, a mixed layer including an organic compound and an inorganic compound can be formed by simultaneously forming each material, thereby combining the same methods or different methods. For example, co-evaporation by resistance heating evaporations, co-evaporation by electron beam evaporations, co-evaporation by resistance heating evaporation and electron beam evaporation, film formation by resistance heating evaporation and sputtering, and film formation by electron beam evaporation and sputtering can be employed.

In addition, as a method for forming the insulating layer 29, an organic insulator typified by polyimide, acryl, polyamide, benzocyclobutene, or epoxy; an organic compound having a high hole-transport property; or an organic compound having a high electron-transport property may be formed over the first conductive layer by using laser transcription. A film with the organic insulator or the organic compound formed thereover is irradiated with laser light in laser transcription. At this time, a surface over which the organic insulator or the organic compound is formed faces the first conductive layer side. The organic insulator or the organic compound irradiated with laser light is peeled off from the film and is fused to the first conductive layer. As a result, the insulating layer can be formed over the first conductive layer. When such a technique is used, an insulating layer can be formed only in a predetermined place.

It is to be noted that the insulating layer 29 is formed to have a thickness which can change conductivity of the memory element by an electric action or an optical action.

In addition, as other methods, spin coating, sol-gel process, printing, a droplet discharge method or the like may be used, and the above methods and these methods are combined to form the insulating layer 29.

In addition, in the present embodiment, an element having a rectifying property may be provided between the first conductive layers 31a to 34a and the insulating layer 29 in the structure as described above. The element having a rectifying property is a transistor in which a gate electrode and a drain electrode are connected, or a diode. Thus, since a current flows only in one direction by providing a diode having a rectifying property, variation in reading of data is reduced, and a reading margin is improved. It is to be noted that the element having a rectifying property may also be provided between the insulating layer 29 and the second conductive layer 28.

Here, a structure of the memory device according to the present invention and a method for writing data will be described.

Figure 4A:
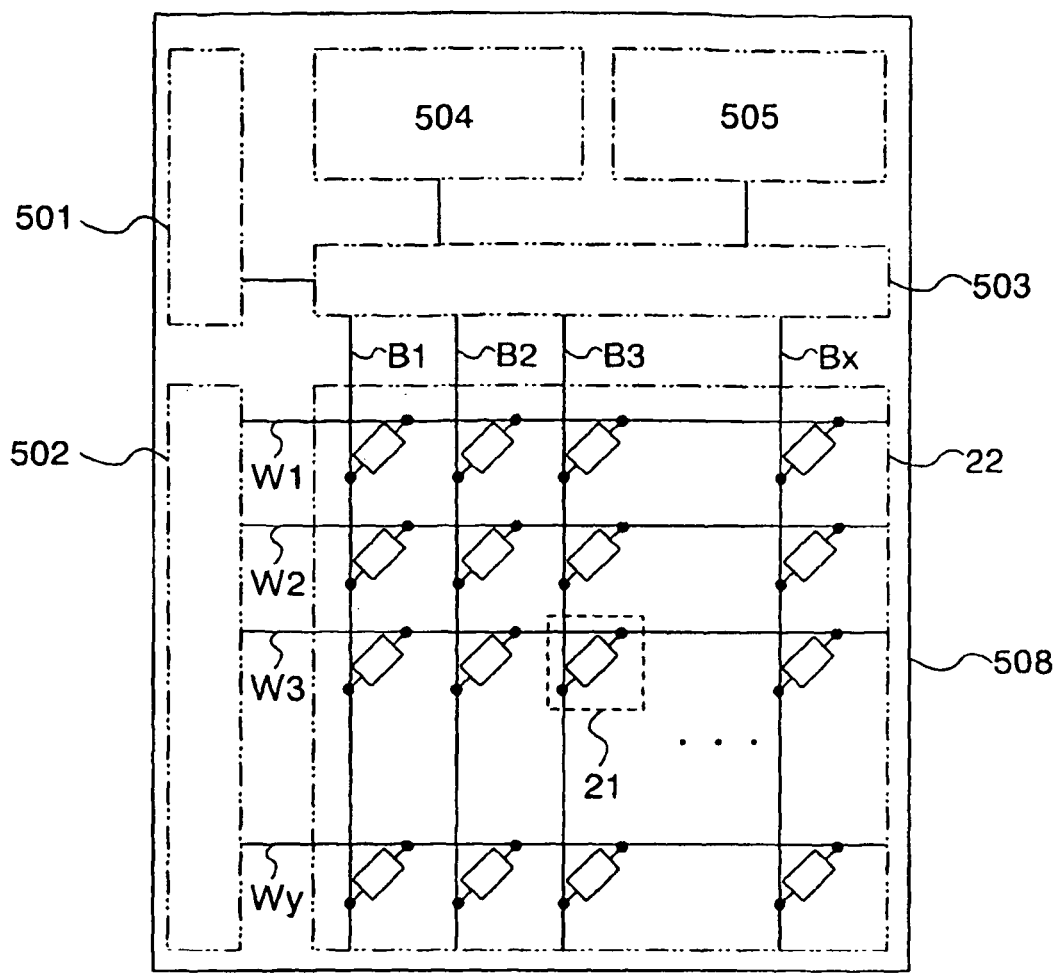
FIGS. 4A and 4B are diagrams illustrating a semiconductor device according to the present invention.

FIG. 4A shows a structure of the memory device according to the present invention. A memory device 508 according to the present invention includes a column decoder 501, a row decoder 502, a reading circuit 504, a writing circuit 505, a selector 503, and a memory cell array 22. The memory cell array 22 includes a bit line Bm ($1 \leq m \leq x$), a word line Wn ($1 \leq n \leq y$), and x×y pieces of memory cell 21 at an intersection point of the bit line and the word line. It is to be noted that the structure of the memory device 508 as shown here is one example. The structure may include other circuits such as a sense amplifier, an output circuit, and a buffer, or a writing circuit may be provided in a bit line driver circuit.

The column decoder 501 receives an address signal to specify a column of the memory cell array, and gives a signal to the selector 503 of a specified column. The selector 503 receives a signal of the column decoder 501, and selects a bit line of the specified column. The row decoder 502 receives an address signal to specify a row of the memory cell array, and selects a word line of a specified row. By the operation as described above, one memory cell 21 corresponding to the address signal is selected. The reading circuit 504 reads data of the selected memory cell, and amplifies and outputs data. The writing circuit 505 produces a voltage necessary for writing, and applies the voltage to a memory element of the selected memory cell to conduct writing of data.

Figure 4B:
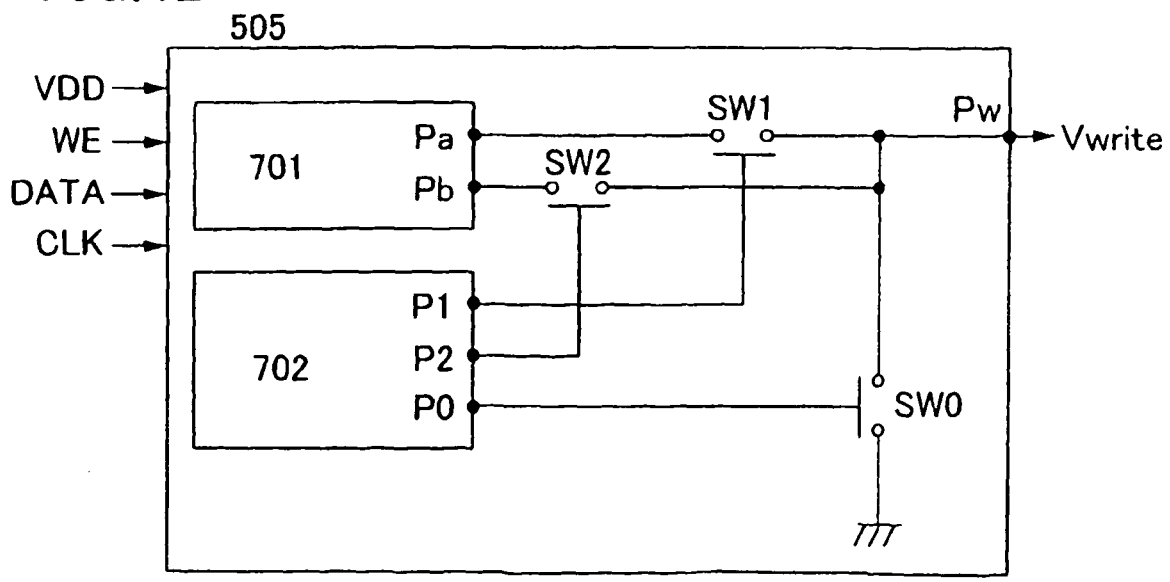

FIG. 4B shows a structure of the writing circuit 505 of the memory device according to the present invention. The writing circuit 505 includes a voltage generating circuit 701, a timing control circuit 702, switches SW0, SW1 and SW2, and an output terminal Pw. The voltage generating circuit 701 is formed by a boosting Circuit or the like, and produces voltages V1 and V2, which are necessary for writing, and outputs V1 and V2 from output terminals Pa and Pb, respectively. The timing control circuit 702 produces signals S0, S1, and S2 controlling the switches SW0, SW1, and SW2 from a writing control signal (hereinafter referred to as WE), a data signal (hereinafter referred to as DATA), a clock signal (hereinafter referred to as CLK) and the like, and outputs the signals from output terminals P0, P1, and P2, respectively. The switch SW0 controls ON/OFF of a connection of Pw and a grounding; SW1 controls ON/OFF of a connection of Pw and the output terminal Pa of the voltage generating circuit; SW2 controls ON/OFF of a connection of Pw and the output terminal Pb, and converts an output voltage Vwrite from the output terminal Pw of the writing circuit.

Figure 15:
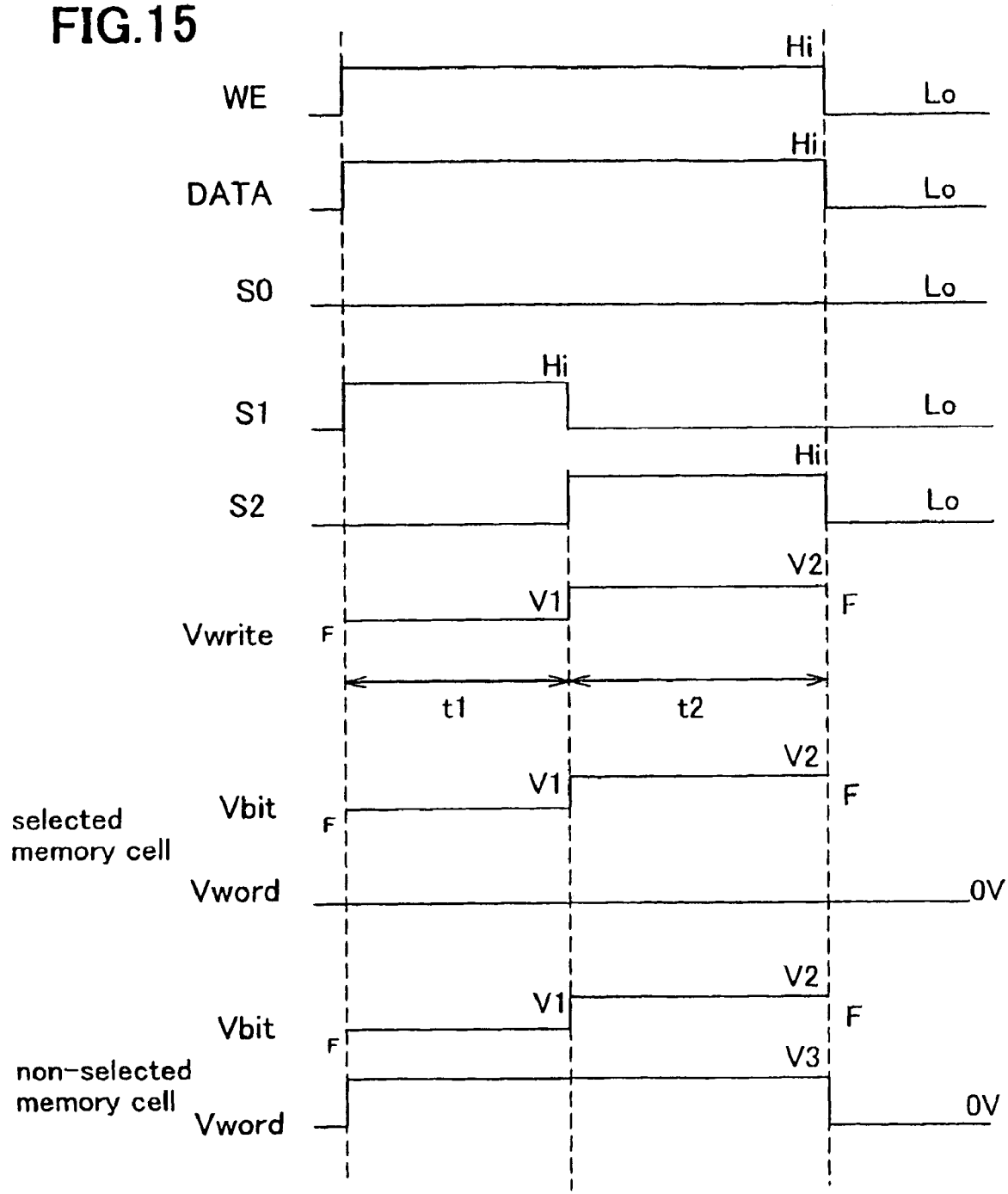
FIG. 15 is a diagram describing a timing chart explaining writing.

FIG. 15 shows a timing chart describing how to conduct writing of "1". The timing chart indicates timings of input signals WE and DATA, output signals S0, S1, and S2, an output voltage Vwrite, voltages Vbit and Vword applied to a memory cell of m-column and n-row.

In the memory cell in the present embodiment mode, a first conductive layer is formed by the word line, and a second conductive layer is formed by the bit line. Therefore, consideration is necessary so as not to conduct wrong writing to the memory cell of m-column and a-row, which is connected to the m-column of the bit line Bm ($1 \leq y$, $a \neq n$). The timing chart also indicates voltages Vbit and Vword which are applied to the memory cell of the m-column and the a-row, which is not selected.

Writing is conducted as follows: First, when input signals WE and DATA become Hi, the voltage generating circuit 701 produces voltages V1 and V2, and outputs V1 and V2 from the output terminals Pa and Pb. The timing control circuit 702 produces signals S0, S1, and S2 controlling the switches from the input signals WE, DATA, CLK, and the like, and outputs the signals from the output terminals P0, P1, and P2. The switches SW0, SW1, and SW2 are converted by the signals, and the writing circuit outputs the voltages V1 and V2 from the output terminal Pw continuously.

At the same time, the column decoder 501, which has received an address signal to specify a column, gives a signal to a selector of m-column. The selector 503 connects the bit line Bm of m-column to the output terminal Pw of the writing circuit. A bit line which is not specified is in a non-connection state (hereinafter, a floating state). Similarly, the row decoder 502, which has received an address signal to specify a row, makes the word line Wn of n-row into 0V, and applies a voltage V3 to a word line Wa which is not specified. The voltage V3 is determined from a range in which conductivity of the memory element is not changed by applying voltages V1-V3 and V2-V3 to the memory element.

By the operation as described above, 0V is applied to the word Line $W_n$, and voltages V1 and V2 are continuously applied to the bit line Bm. Thus, conductivity of the memory element is changed, and the memory cell of m-column and n-row stores "1". At the same time, V3 is applied to the word line Wa, and the voltages V1 and V2 are continuously applied to the bit line Bm. Therefore, the voltages V1-V3 and V2-V3 are continuously applied to the memory element, and it is controlled not to conduct writing to the memory cell.

When the input signal WE becomes Lo, all the word lines have 0V, and all the bit lines are in a floating state. At the same time, the timing control circuit produces signals S0, S1, S2=Lo, which are outputted from the output terminals P0, P1 and P2. The output terminal Pw of the writing circuit is in a floating state. By the operation as described above, writing is not conducted.

By continuously applying voltages of plural levels to a memory element, conductivity can be changed at a low voltage for a short voltage-applying time even in a memory element having a small size. In addition, current consumption in writing can be reduced and a time for maximal current consumption can be shortened by means of the present invention. Therefore, downsizing of the voltage generating circuit of the writing circuit and downsizing of the memory device can be realized. In addition, when a high pulse voltage is applied to a memory element, variation is generated in the amount of change in conductivity so that reliability of a memory device is lowered. However, by continuously applying voltages of plural levels to a memory element as in the present invention, the amount of change in conductivity of a memory element can be constant so that reliability of the memory device can be improved. Further, in the present invention, an organic compound is used for a material of the memory element, and thus, the memory element can be manufactured over a large-sized glass substrate or flexible substrate by low-temperature processing so that an inexpensive memory device can be provided.

Subsequently, a case where writing of data is conducted by an optical action will be described. In this case, laser light irradiation is conducted to the insulating layer from the light-transmitting conductive layer side by using a laser irradiation apparatus.

When the insulating layer is selectively irradiated with laser light, the insulating layer is oxidized or carbonized to be insulating. Then, the resistance value of a memory element 80 that is irradiated with laser light is increased, while the resistance value of a memory element 80 that is not irradiated with laser light is not changed.

Figure 11A:
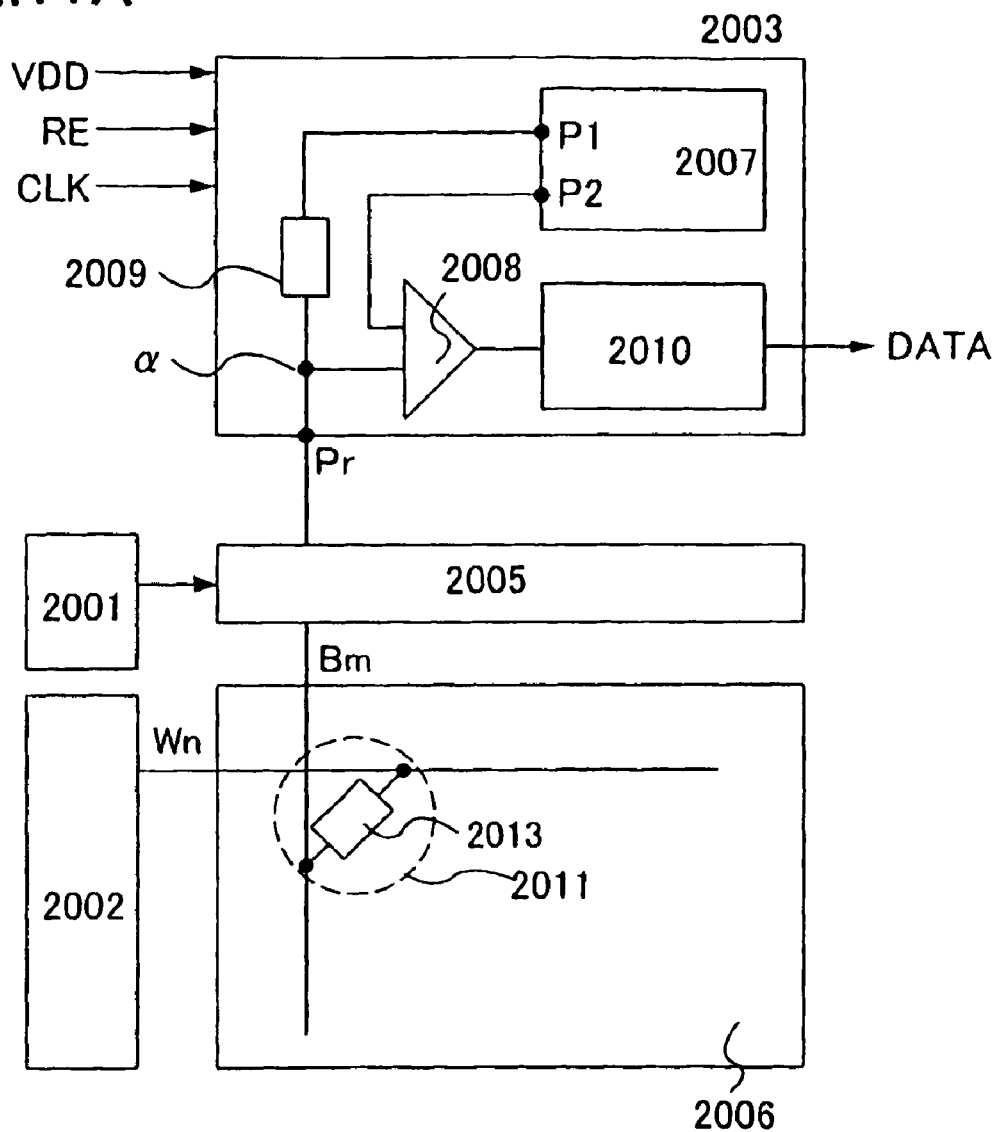
FIGS. 11A and 11B are diagrams illustrating a reading circuit of a memory device according to the present invention.

Then, reading of data will be described. FIG. 11A shows a memory device, of which only necessary portions are represented to explain reading. The memory device includes a column decoder 2001, a row decoder 2002, a reading circuit 2003, a selector 2005, and a memory cell array 2006. The memory cell array 2006 includes a bit line Bm ($1 \leq m \leq x$), a word line Wn ($1 \leq n \leq y$) and x×y pieces of memory cell 2011 at an intersection point of the bit line and the word line. In the present embodiment mode, the memory cell 2011 has a memory element 2013. The reading circuit 2003 includes a voltage generating circuit 2007, a sense amplifier 2008, a resistive element 2009, a data output circuit 2010, and an input/output terminal Pr. An input point to the sense amplifier 2008 between the resistive element 2009 and the input/output terminal Pr is $\alpha$.

The voltage generating circuit 2007 produces voltages Vread and Vref which are necessary for a reading operation, and outputs Vread and Vref from P1 and P2, respectively. Since a low voltage is used in reading of data, a power supply voltage (VDD) can also be used for the voltage Vread. The voltage Vref is a voltage lower than Vread, and can be produced by resistive division of the power supply and a ground voltage. Thus, the voltage generating circuit 2007 of the reading circuit 2003 has a structure which is different from a structure of the voltage generating circuit of the writing circuit. The sense amplifier 2008 compares levels of a voltage at the point a and the voltage Vref, and outputs the result. The data output circuit 2010 is controlled by a reading control signal (hereinafter referred to as RE), and receives data of a memory cell from the output terminal of the sense amplifier 2008, and amplifies and outputs the data.

Next, an operation of reading data of the memory cell 2011 of m-column and n-row will be described. First, the column decoder 2001, which has received an address signal to specify a column, gives a signal to the selector 2005 of m-column. The selector 2005 connects a bit line Bm of m-column to the input/output terminal Pr of the reading circuit. A bit line which is not specified is in floating state. Similarly, the row decoder 2002, which has received an address signal to specify a row, applies the voltage Vread to a word line Wn of n-row and 0V to a word line which is not specified. At the same time, the voltages Vread and Vref are outputted from the output terminals P1 and P2 of the voltage generating circuit 2007. By the operation as described above, a state is obtained, in which the voltage Vread is applied to series resistance of the resistive element 2009 and the memory element 2013 so that the voltage at the point a has the value obtained by resistive division of the two elements.

Here, I-V characteristics 2115 of the memory element in which writing of "1" is conducted, I-V characteristics 2116 of the memory element in which writing of "0" is conducted, and I-V characteristics 2117 of the resistive element 2109 are indicated in FIG. 14 in order to explain the voltage which the point a can have. The resistive element 2109 is a transistor here. In addition, a horizontal axis of FIG. 14 represents the voltage at the point $\alpha$. As for I-V characteristics 2115 of the memory element in which writing of "1" is conducted, the current value is changed even when the voltage at the point $\alpha$ is low because of the low resistance value of the memory element 2113. As for I-V characteristics 2116 of the memory element in which writing of "0" is conducted, the current value begins to increase when the voltage at the point a becomes a certain value or more since the memory element 2113 represents diode characteristics. As for I-V characteristics 2117 of the resistive element, the current value decreases when the voltage at the point a increases, and the current value is 0 when the voltage at the point $\alpha$ is Vread.

In accordance with FIG. 14, the voltage which the point $\alpha$ can have can be explained as follows: When "1" is written in the memory element 2113, a voltage VA at an intersection point A of I-V characteristics 2115 of the memory element in which writing of "1" is conducted and I-V characteristics 2117 of the resistive element is a voltage at the point $\alpha$. In addition, when "0" is written in the memory element 2113, a voltage VB at an intersection point B of I-V characteristics 2116 of the memory element in which writing of "0" is conducted and I-V characteristics 2117 of the resistive element is a voltage at the point $\alpha$.

Subsequently, the sense amplifier 2108 compares a level of the voltage at the point $\alpha$ and Vref. Here, the voltage Vref is higher than the voltage VA and lower than the voltage VB, preferably it is (VA+VB)/2. By setting the voltages as described above, when the voltage at the point $\alpha$ is judged to be lower than Vref by the sense amplifier 2108, the voltage at the point $\alpha$ is considered to be the voltage VA, and it is found that "1" is written in the memory element 2113. On the other hand, when the voltage at the point $\alpha$ is judged to be higher than Vref, the voltage at the point $\alpha$ is considered to be the voltage VB, and it is found that "0" is written in the memory element 2113.

When the voltage at the point $\alpha$ is lower than Vref, the sense amplifier outputs a signal representing "1". When the voltage at the point $\alpha$ is higher than Vref, the sense amplifier outputs a signal representing "0". The data output circuit 2110 takes data from an output signal of the sense amplifier 2108 based on a control signal RE inputted from outside, and amplifies and outputs the data.

By the operation as described above, reading can be conducted.

In the present embodiment mode, the resistance value of the memory element is read by replacing it into a level of the voltage, but the present invention can be implemented without being limited thereto. Specifically, a method of reading the resistance value of a memory element by replacing it into a level of a current, or a method of precharging a bit line can also be employed.

By forming a memory element by using a conductive layer having a convex portion, a drive voltage at a time for writing of data can be reduced. Accordingly, a memory device and a semiconductor device consuming low power can be provided.

Embodiment Mode 2

In the present embodiment mode, a memory device having a different structure from the Embodiment Mode 1 will be described. Specifically, a case where a structure of a memory device is an active matrix type will be described.

Similarly to the memory device 508 in the Embodiment Mode 1, a structural example of a memory device in the present embodiment mode includes a column decoder 501, a row decoder 502, a reading circuit 504, a writing circuit 505, a selector 503, and a memory cell array 22 as shown in FIG. 4A. The memory cell array 22 includes a bit line Bm ($1 \leq m \leq x$), a word line Wn ($1 \leq n \leq y$), and x×y pieces of memory cell 21 at an intersection point of the bit line and the word line.

The memory cell 21 includes a first wiring forming the bit line Bm ($1 \leq m \leq x$), a second wiring forming the word line Wn ($1 \leq n \leq y$), a transistor 240, and a memory element 241. The memory element 241 has a structure in which an insulating layer is interposed between a pair of conductive layers.

Next, examples of a top view and a cross-sectional view of a memory cell array 222 having the structure as described above will be described with reference to FIGS. 5, 6A to 6C. It is to be noted that FIG. 6A shows an example of a top view of the memory cell array 222, and FIG. 6B shows a cross-sectional view along A-B of FIG. 6A.

Figure 5:
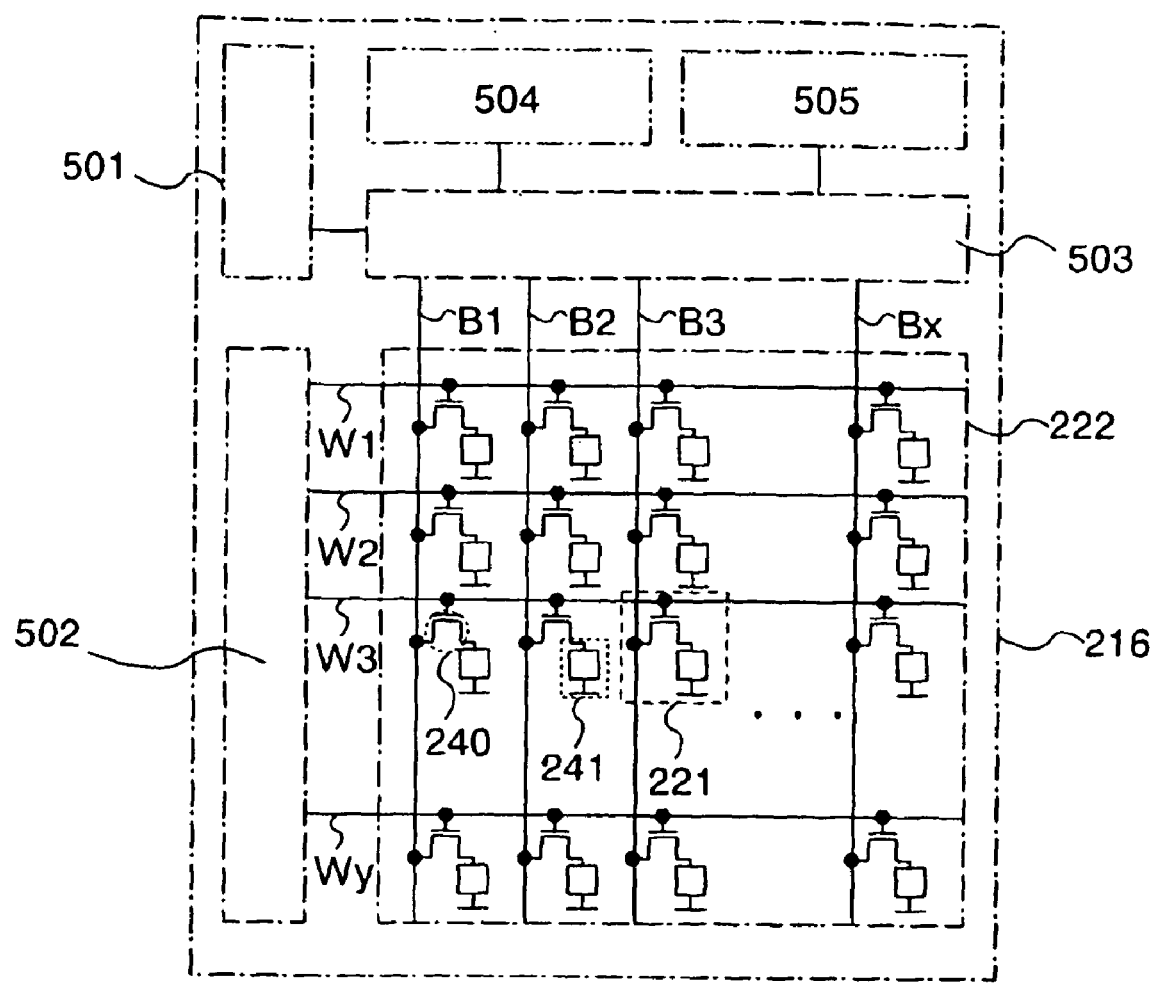
FIG. 5 is a diagram illustrating a semiconductor device according to the present invention.
Figure 6A:
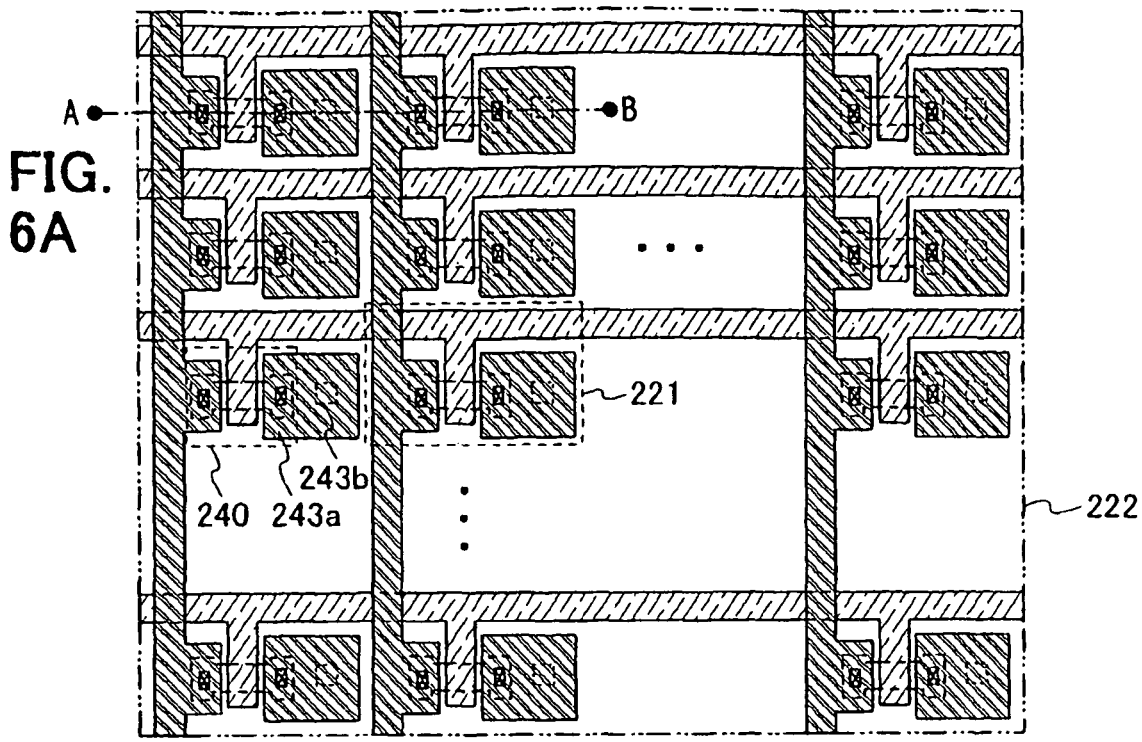
FIG. 6A is a top view and FIGS. 6B and 6C are cross-sectional views illustrating a semiconductor device according to the present invention.
Figure 6B:
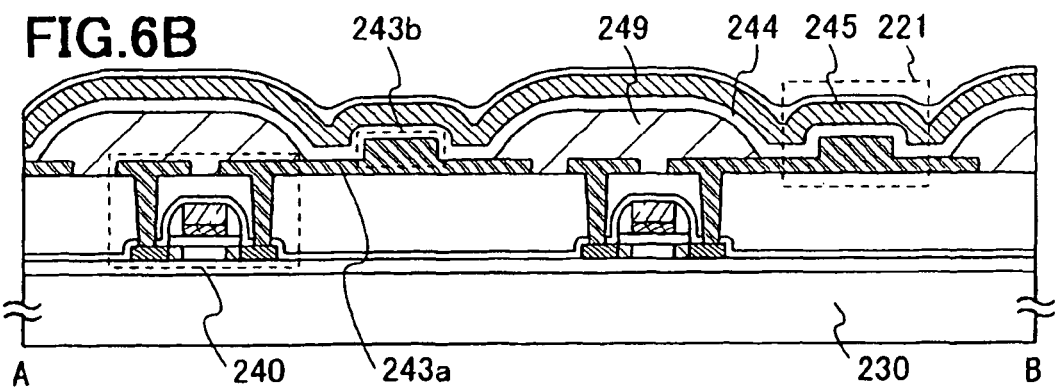

The memory cell array 222 includes a plurality of transistors 240 functioning as a switching element and memory elements 241 connected to the transistors 240 over a substrate 230 having an insulated surface (refer to FIG. 5, FIGS. 6A and 6B). The memory element 241 includes a first conductive layer 243a having a convex portion 243b, a second conductive layer 245 and an insulating layer 244, where the insulating layer 244 is interposed between the first conductive layer 243a and the second conductive layer 245. Here, an insulating layer (also referred to as a partition) 249 is provided between adjacent memory cells 221, and the insulating layer 244 and the second conductive layer 245 are stacked over the first conductive layer and the insulating layer 249. In addition, a TFT is used as the transistor 240 (refer to FIG. 6B).

Figure 6C:
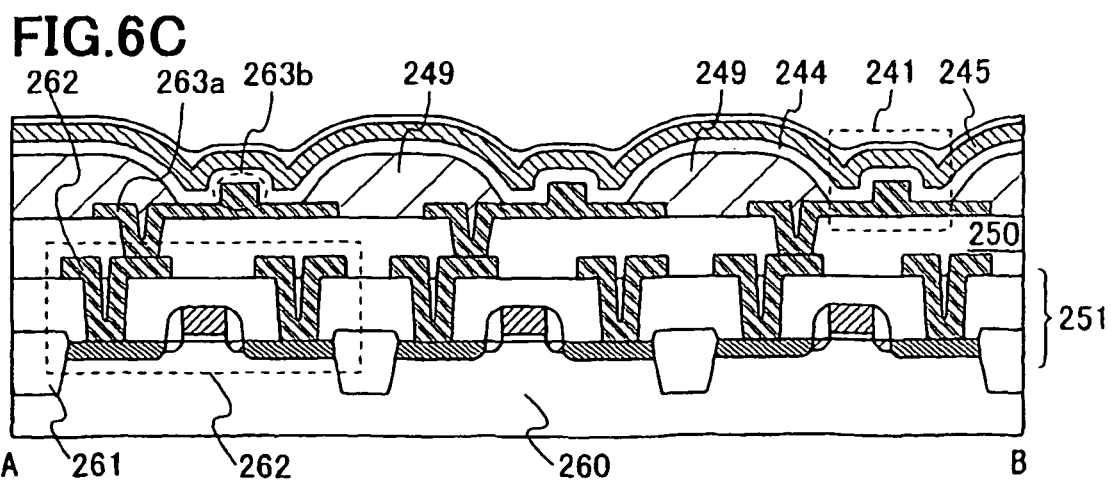

In addition, as shown in FIG. 6C, the memory element 241 may be connected to a field effect transistor 262 provided over a single crystal semiconductor substrate 260. Here, an insulating layer 250 is provided to cover a source electrode and a drain electrode of the field effect transistor 262. The memory element 241 is formed by a first conductive layer 263a, an insulating layer 244 and a second insulating layer 245 over the insulating layer 250. In addition, a convex portion 263b is provided in the first conductive layer 263a.

In the structure as described above, the insulating layer 244 is provided over the entire-surface, but the insulating layer 244 may also be selectively provided only in each memory cell. In this case, the insulating layer 244 is selectively provided by using a droplet discharge method or the like so that use efficiency of a material can be improved.

As described above, the insulating layer 250 is provided, and the memory element 241 is formed over the insulating layer 250; and thus, the first conductive layer 263a can be freely located. That is to say, it is necessary to provide the memory element 241 in a region which avoids the first conductive layer 243a functioning as a source or drain electrode of the transistor 240 in the structure of FIGS. 6A and 6B; however, by the structure as described above, for example, the memory element 241 can be formed above the transistor 240 provided in an element formation layer 251. Accordingly, a memory circuit 216 can be more higher-integrated.

Moreover, the transistor 240 may have any structure as long as it can function as a switching element. Typically, an organic compound may be used to form an organic transistor. FIG. 6A shows an example in which a planar type thin film transistor is formed over a substrate having an insulating property, but a transistor of a staggered type or an inverted staggered type can also be formed.

In addition, a semiconductor layer included in a transistor may have any structure; for example, an impurity region (including a source region, a drain region, and an LDD region) may be formed, and any of a p-channel type or an n-channel type may be employed. Further, an insulating layer (a sidewall) may be formed to be in contact with a side face of a gate electrode, or a silicide layer may be formed over one or both of a source/drain region and a gate electrode. As a material for the silicide layer, nickel, tungsten, molybdenum, cobalt, platinum or the like can be used.

Any of the materials and the forming methods described in the Embodiment Mode 1 can be used to form the first conductive layer 243a and the second conductive layer 245.

In addition, the insulating layer 244 can be provided by using the same materials and forming methods as the insulating layer 29 described in the Embodiment Mode 1.

In addition, an element having a rectifying property may be provided between the first conductive layer 243a and the insulating layer 244. The element having a rectifying property is a transistor in which a gate electrode and a drain electrode are connected, or a diode. For example, a P-N junction diode can be used, in which an N-type semiconductor layer and a P-type semiconductor layer are stacked. Thus, since a current flows only in one direction by providing a diode having a rectifying property, variation in reading of data is reduced, and a reading margin is improved. When a diode is provided, not a diode having a P-N junction but a diode having other structure such as a diode having a PIN junction or an avalanche diode may also be used. It is to be noted that the element having a rectifying property may be provided between the insulating layer 244 and the second conductive layer 245.

Then, an operation of conducting writing of data to the memory circuit 216 will be described (FIG. 5). The writing circuit has the same structure as in FIG. 4B.

As shown in FIG. 5, the memory cell includes the transistor 240 and the memory element 241. The memory element is represented using a rectangle shape in the accompanying drawings of the present specification. In the transistor 240, a word line is connected to a gate electrode, a bit line is connected to one high-concentrated impurity region, and a first conductive layer of the memory element 241 is connected to the other high-concentrated impurity region. There is continuity between the second conductive layer of the memory element 241 and the second conductive layers of all the memory elements in the memory cell array. In an operation of the memory device, namely, in writing and reading, a constant voltage is applied to the second conductive layer. Therefore, there is a case where the second conductive layer is referred to as a common electrode in the present specification.

Figure 9:
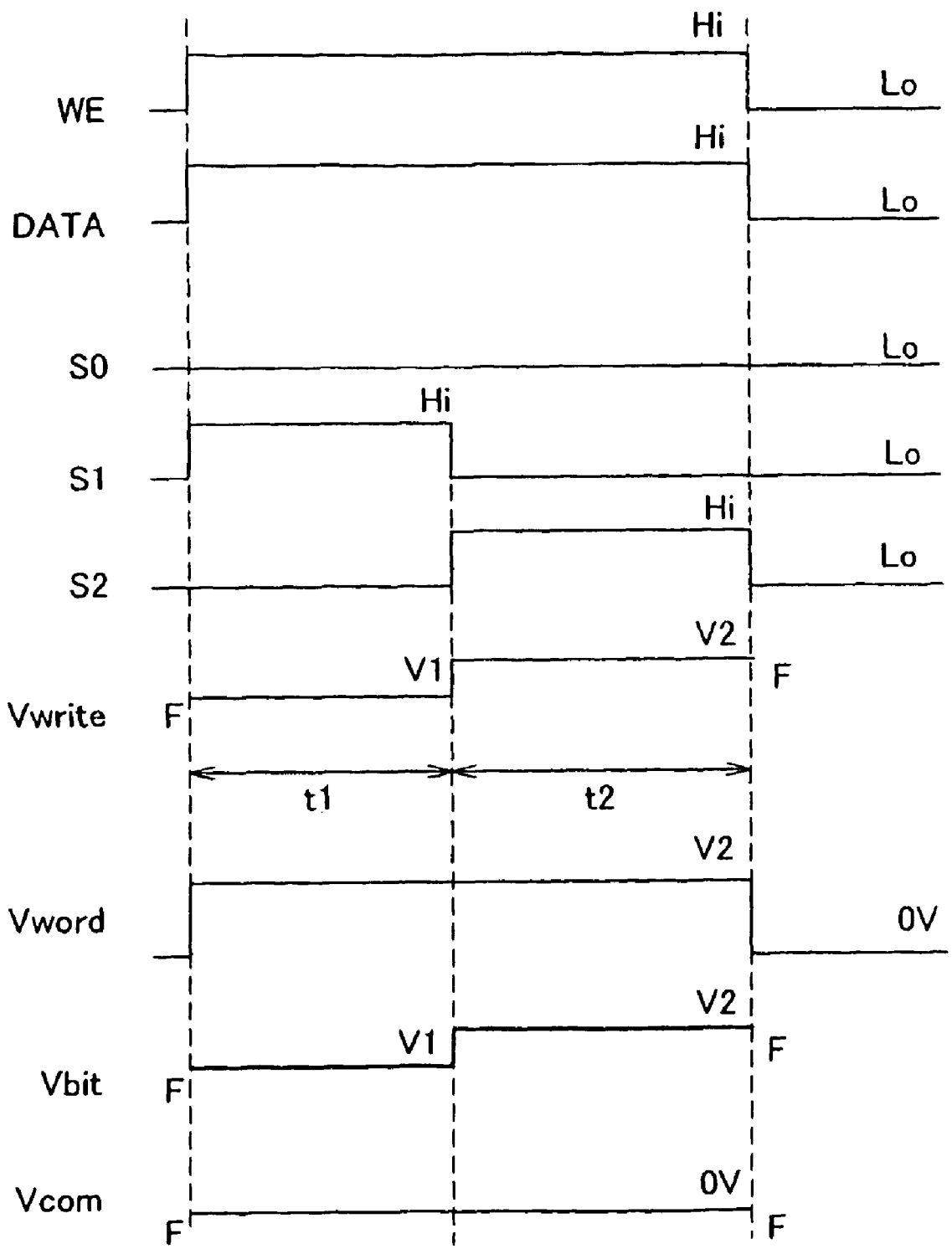
FIG. 9 is a diagram describing a timing chart explaining writing of a memory device according to the present invention.

FIG. 9 shows a timing chart for describing writing of "1". The timing chart indicates timings of input signals WE and DATA from outside, output signals S0, S1, and S2 of a timing control circuit 702, an output voltage Vwrite of the writing circuit, voltages Vbit, Vword and Vcom applied to a selected memory cell. As for the input signal WE, a low voltage (hereinafter referred to as Lo) means a writing-disable state and a high voltage (hereinafter referred to as Hi) means a writing-enable state. As for the input signal DATA, Hi means "1" and Lo means "0". The output signals S0, S1 and S2 control OFF of the switch by Lo and ON by Hi. In addition, the applied voltage Vbit is a voltage applied to the bit line, Vword is a voltage applied to the word line, and Vcom is a voltage applied to the common electrode. These abbreviations are used hereinafter.

Writing is conducted as follows: First, when the input signal WE becomes Hi, the column decoder 501, which has received an address signal to specify a column, gives a signal to a selector of a specified column. The selector 503 connects the bit line of the specified column to the output terminal Pw of the writing circuit. A bit line which is not specified is in a floating state. The row decoder 502, which has received an address signal to specify a row, applies a voltage V2 to a word line of a specified row, and applies 0V to a word line which is not specified. By the operation as described above, a memory cell 221 corresponding to the address signal is selected. Here, 0V is applied to the common electrode.

At the same time, by the input signal DATA=Hi, the voltage generating circuit 701 produces voltages V1 and V2, and outputs V1 and V2 from the output terminals Pa and Pb. The timing control circuit 702 produces signals S0, S1, and S2 controlling the switches from the input signals WE, DATA, CLK, and the like, and outputs the signals from the output terminals P0, P1, and P2. The switches SW0, SW1, and SW2 are converted, by the signals, and the writing circuit outputs the voltages V1 and V2 from the output terminal Pw continuously.

In the selected memory cell, by the operation as described above, the voltage V2 is applied to the word line, voltages V1 and V2 are applied continuously to the bit line, and 0V is applied to the common electrode. Thus, continuity is established between two high-concentrated impurity regions of the transistor, and the voltage of the bit line is applied to the first conductive layer of the memory element. Therefore, conductivity of the memory element is changed so that "1" is stored.

When the input signal WE becomes Lo, all the word lines have 0V, and all the bit lines and the common electrode are in a floating state. At the same time, the timing control circuit produces signals S0, S1, S2=Lo, which are outputted from the output terminals P0, P1 and P2. The output terminal Pw of the writing circuit is in a floating state. By the operation as described above, writing is not conducted. In FIG. 9, a floating state is referred to as F, and this abbreviation is used hereinafter.

Figure 10:
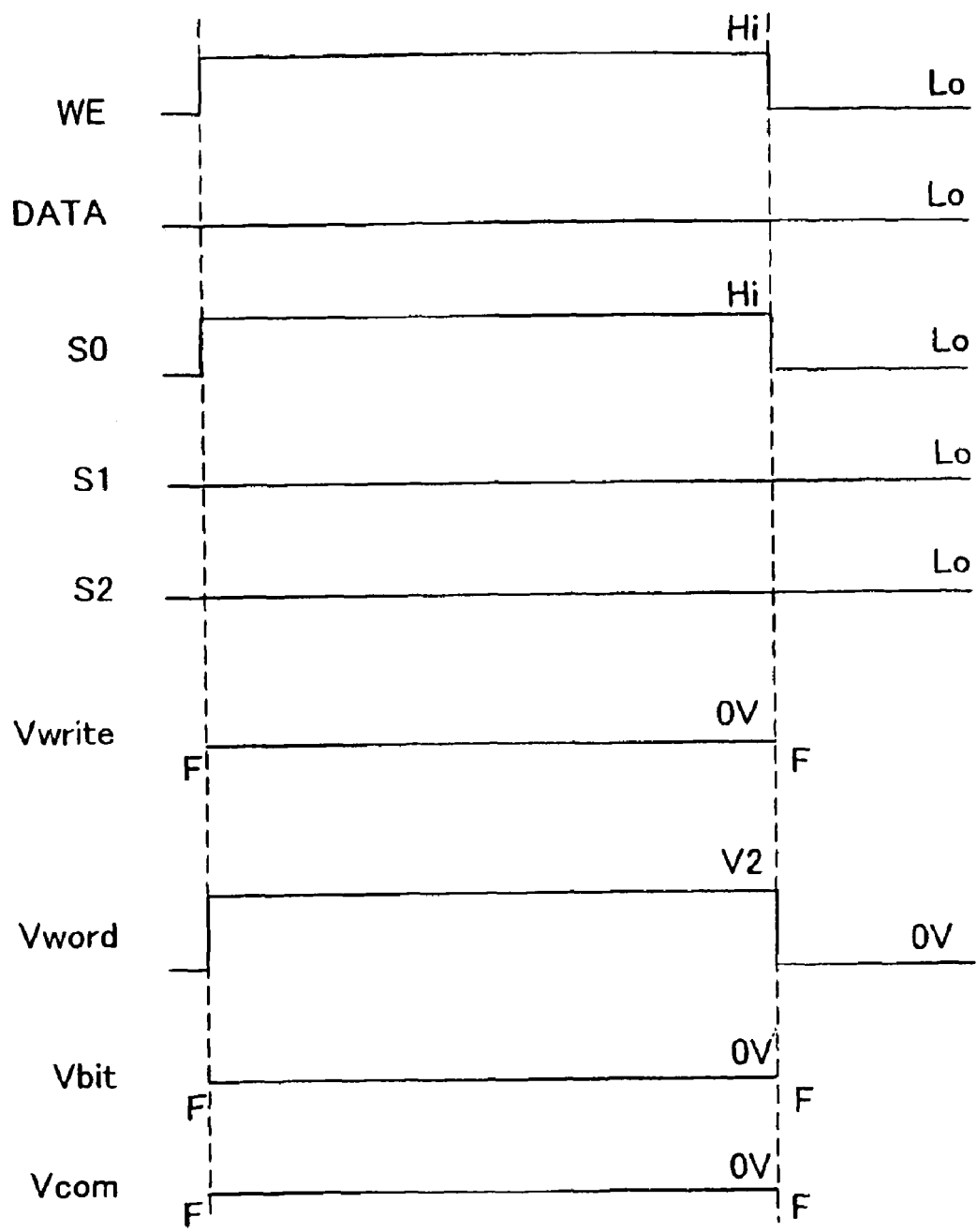
FIG. 10 is a diagram describing a timing chart explaining writing of a memory device according to the present invention.

Then, FIG. 10 shows a timing chart for describing writing of "0". The timing chart indicates timings of input signals WE and DATA, output signals S0, S1, and S2, an output voltage Vwrite, applied voltages Vbit, Vword and Vcom as in FIG. 9. Writing of "0" does not change conductivity of the memory element, which is accomplished by applying no voltage to the memory element. In the present embodiment mode, a method of applying 0V to the bit line and the common electrode will be described.

First, similarly to writing of "1", when the input signal WE becomes Hi, the column decoder 501, which has received an address signal to specify a column, gives a signal to a selector of a specified column. The selector 503 connects the bit line of the specified column to the output terminal Pw of the writing circuit. A bit line which is not specified is in a floating state. Similarly, the row decoder 502, which has received an address signal to specify a row, applies a voltage V2 to a word line of a specified row, and applies 0V to a word line which is not specified. By the operation as described above, a memory cell 21 corresponding to the address signal is selected. Here, 0V is applied to the common electrode.

At the same time, by the input signal DATA=Lo, the timing control circuit 702 produces control signals S0=H1, S1=Lo and S2=Lo, which are outputted from the output terminals P0, P1 and P2. By the control signals, the switch SW0 is ON, SW1 and SW2 are OFF, and the writing circuit outputs 0V from the output terminal Pw.

In the selected memory cell, by the operation as described above, V2 is applied to the word line, and 0V is applied to the bit line and the common electrode. Therefore, no voltage is applied to the memory element, and conductivity is not changed so that "0" is stored.

When the input signal WE becomes Lo, 0V is applied to all the word lines, and all the bit lines and the common electrode are in a floating state. At the same time, the timing control circuit produces signals S0, S1, S2=Lo, which are outputted from the output terminals P0, P1 and P2. Output from the writing circuit is in a floating state.

In accordance with the structure and means of the present invention, conductivity can be changed at a low voltage for a short voltage-applying time even in a memory cell having a small size. In addition, current consumption in writing can be reduced and a time for maximal current consumption can be shortened by the present invention. Therefore, downsizing of a voltage generating circuit in a writing circuit and downsizing of a memory device can be realized.

In addition, when a high pulse voltage is applied to a memory element, variation is generated in the amount of change in conductivity so that reliability of a memory device is lowered. However, by continuously applying voltages of plural levels as in the present invention, the amount of change in conductivity of a memory element can be constant so that reliability of a memory device can be improved.

A case of conducting writing of data by an optical action is the same as in the Embodiment Mode 1.

Figure 11B:
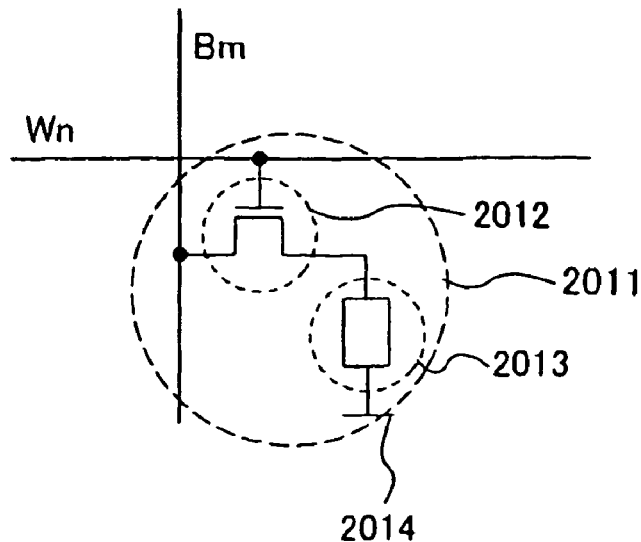

The memory device according to the present embodiment mode includes a column decoder 2001, a row decoder 2002, a reading circuit 2003, a selector 2005, and a memory cell array 2006. The memory cell array 2006 includes a bit line Bm ($1 \leq m \leq x$), a word line Wn ($1 \leq n \leq y$), and x×y pieces of memory cell 2011 at an intersection point of the bit line and the word line. In the present embodiment mode, the memory cell 2011 includes a transistor 2012, a memory element 2013, and a common electrode 2014 (refer to FIG. 11B). It is to be noted that an operation of reading is the same as in the Embodiment Mode 1.

It is to be noted that the present embodiment mode can be used by freely combining with the above embodiment modes.

By forming a memory element by using a conductive layer having a convex portion, a drive voltage at a time for writing of data can be reduced. As a result, a memory device and a semiconductor device consuming low power can be provided.

Embodiment Mode 3

In the present embodiment mode, an example of a semiconductor device having a memory device shown in the above embodiment modes will be described with reference to the drawings.

In the semiconductor device according to the present embodiment mode, there is a feature that non-contact reading and writing of data are possible. The data transmission methods are classified broadly into three of an electromagnetic coupling method of communicating by mutual induction with a pair of coils disposed in the opposed positions, an electromagnetic induction method of communicating by an inductive electromagnetic field, and an electric wave method of communicating by using electric waves. Any of these methods may be employed. In addition, an antenna used for transmitting of data can be provided in two ways. In one way, the antenna is provided over a substrate over which a plurality of elements and memory elements are provided. In the other way, a terminal portion is provided over a substrate over which a plurality of elements and memory elements are provided, and the antenna provided over the other substrate is connected to the terminal portion.

First, a structural example of a semiconductor device in a case where an antenna is provided over a substrate over which a plurality of elements and memory elements are provided will be described with reference to FIGS. 7A and 7B.

FIG. 7A shows a semiconductor device having a memory device of a passive matrix type. An element formation layer 351 including transistors 451 and 452 is provided over a substrate 350, and a memory element portion 352 and a conductive layer 353 functioning as an antenna are provided above the element formation layer 351. Here, the transistor 452 forming a memory device, a power supply circuit, a clock generating circuit, and the transistor 451 forming a data demodulation/modulation circuit are shown.

The case where the memory element portion 352 or the conductive layer 353 functioning as an antenna is provided above the element formation layer 351 is shown here, but the structure is not limited thereto, and the memory element portion 352 or the conductive layer 353 functioning as an antenna can be provided below the element formation layer 351 or in the same layer.

The memory element portion 352 is formed by memory elements 352a and 352b. The memory element 352a is formed by stacking an insulating layer 362a and a second conductive layer 363a over a first conductive layer 361a having a convex portion 361b. The memory element 352b is formed by stacking an insulating layer 362b and a second conductive layer 363b over the first conductive layer 361a having a convex portion. In addition, an insulating layer 366 functioning as a protective film is formed to cover the second conductive layers 363a and 363b. Further, the first conductive layer 361a over which a plurality of memory elements 352a and 352b are formed is electrically connected to a source electrode or a drain electrode of one transistor. In addition, the insulating layer 362 is provided with an insulating layer (also referred to as a partition) 374 to isolate the insulating layer in every memory cell, but when an influence of an electric field in a lateral direction is not concerned in adjacent memory cells, the insulating layer 362 may be formed over the entire surface to cover the first conductive layer 361a. The memory element portion 352 can be formed by using the materials or the manufacturing methods described in the above embodiment modes.

In addition, in the memory element 352a, an element having a rectifying property may be provided between the first conductive layer 361a and the insulating layer 362a, or between the insulating 362a and the second conductive layer 363a as described in the above embodiment modes. As the element having a rectifying property, the one as described in the above embodiments can be used. It is to be noted that a structure of the memory element 352b is the same as the memory element 352a.

Here, the conductive layer 353 functioning as an antenna is provided over a conductive layer 360 which is formed at the same time as the second conductive layers 363a and 363b. The conductive layer functioning as an antenna may be formed at the same time as the second conductive layer 363.

As a material for the conductive layer 353 functioning as an antenna, an alloy containing one or a plurality of elements selected from gold (Au), platinum (Pt), nickel (Ni), tungsten (W), molybdenum (Mo), cobalt (Co), copper (Cu), aluminum (Al), manganese (Mn), or titanium (Ti), or the like can be used. In addition, as a method for forming the conductive layer 353 functioning as an antenna, evaporation, sputtering, CVD, various printing methods such as screen printing and gravure printing, a droplet discharge method or the like can be used.

The transistors 451 and 452 included in the element formation layer 351 may be formed by a p-channel TFT, an n-channel TFT, or a CMOS circuit in which a p-channel TFT and an n-channel TFT are combined. A semiconductor layer included in the transistors 451 and 452 may have any structure; for example, an impurity region (including a source region, a drain region, and an LDD region) may be formed, and any of a p-channel type or an n-channel type may be employed. Further, an insulating layer (a sidewall) may be formed to be in contact with a side face of a gate electrode, or a silicide layer may be formed over one or both of a source/drain region and a gate electrode. As a material for the silicide layer, nickel, tungsten, molybdenum, cobalt, platinum or the like can be used.

In addition, the transistor 451 included in the element formation layer 351 may be formed by an organic transistor in which a semiconductor layer forming the transistor is formed by an organic compound. In this case, the element formation layer 351 formed by using an organic transistor can be formed over a flexible substrate such as a plastic as the substrate 350 by direct printing, a droplet discharge method or the like. Further, in such a case, a semiconductor device can be manufactured at a low cost by forming the memory element portion 352 also with the use of a printing method, a droplet discharge method or the like as described above.

FIG. 7B shows an example of a semiconductor device having a memory device of an active matrix type. As for FIG. 7B, only different parts from FIG. 7A will be explained.

In a semiconductor device shown in FIG. 7B, an element formation layer 351 including transistors 451 and 452 is provided over a substrate 350, and a memory element portion 356 and a conductive layer 353 functioning as an antenna are provided above the element formation layer 351. Here, the transistor 452 functioning as a switching element of the memory element portion 356 is provided in the same layer as the transistor 451, and the memory element portion 356 and the conductive layer 353 functioning as an antenna are provided above the element formation layer 351. However, the structure is not limited thereto, and the transistor 452 may be provided above or below the element formation layer 351, or the memory element portion 356 or the conductive layer 353 functioning as an antenna can be provided below the element formation layer 351 or in the same layer.

The memory element portion 356 is formed by memory elements 356a and 356b. The memory element 356a is formed by stacking an insulating layer 372 and a second conductive layer 373 over a first conductive layer 371a having a convex portion. The memory element 356b is formed by stacking the insulating layer 372 and the second conductive layer 373 over a first conductive layer 371b having a convex portion. In addition, an insulating layer 376 is formed as a protective film to cover the second conductive layer 373. Further, the first conductive layers 371a and 371b having a convex portion are connected to a source electrode or a drain electrode of the transistors. In other words, each memory element is connected to one transistor. In addition, an insulating layer 374 is formed to cover end portions of the first conductive layers 371a and 371b, and the insulating layer 372 is formed over the entire surface to cover the first conductive layers 371a and 371b, and the insulating layer 374; however, the insulating layer 372 may also be selectively provided in each memory cell. The memory elements 356a and 356b can be formed by using the materials or the manufacturing methods described in the above embodiment modes. In addition, also in the memory elements 356a and 356b, an element having a rectifying property may be provided between the first conductive layers 371a, 371b and the insulating layer 372, or between the insulating layer 372 and the second conductive layer 373.

The element formation layer 351, the memory element portion 356, and the conductive layer 353 functioning as an antenna can be formed by using evaporation, sputtering, CVD, printing, a droplet discharge method or the like. It is acceptable that a different method is used for each portion. Specifically, the transistor 451 that needs a high speed operation is crystallized by a heat treatment after a semiconductor layer composed of Si, GaN, GaAs, InP or the like is formed over a substrate; and then, a transistor 452 functioning as a switching element may be provided as an organic transistor by a printing method or a droplet discharge method above the element formation layer 351.

In addition, a sensor connected to the transistor may also be provided. As a sensor, an element can be used, which detects a temperature, humidity, illuminance, a gas, gravity; pressure, a sound (vibration), an acceleration speed, and other characteristics by physical or chemical means. The sensor is typically formed by an element such as a resistive element, a capacitive coupling element, an inductive coupling element, a photovoltaic element, a photoelectric conversion element, a thermal electromotive force element, a transistor, a thermistor, a diode, an electrostatic capacitive element, a piezoelectric element, or the like.

Figure 8A:
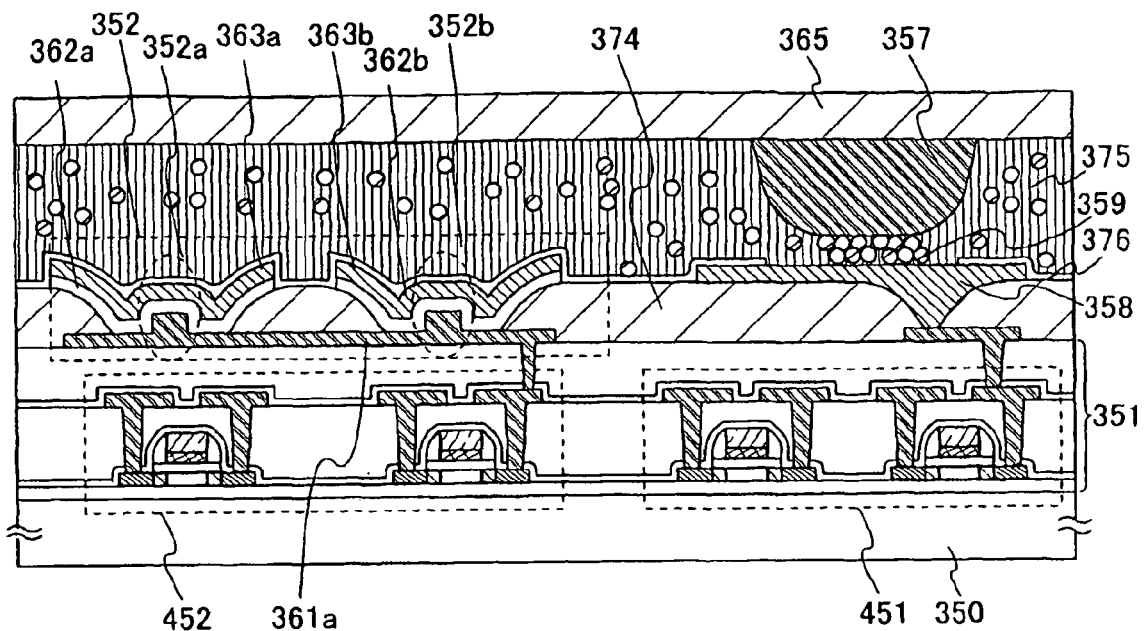
FIGS. 8A and 8B are cross-sectional views illustrating a semiconductor device according to the present invention.
Figure 8B:
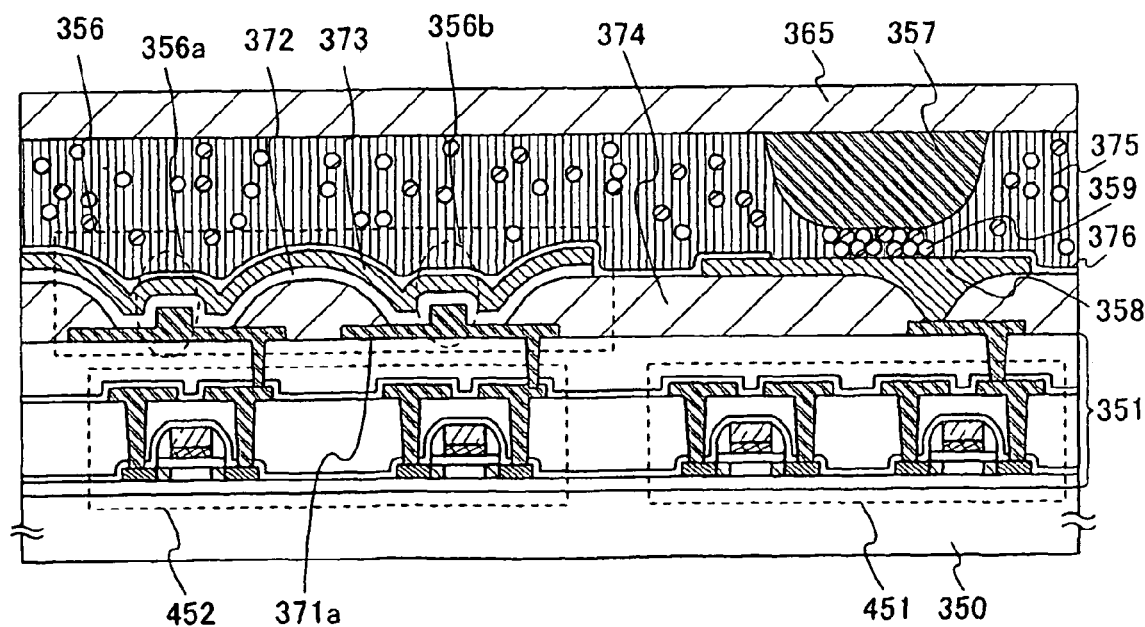

With reference to FIGS. 8A and 8B, a structural example of a semiconductor device will be described, in which a terminal portion is provided over a substrate over which a plurality of elements and memory elements are provided, and an antenna provided over the other substrate is connected to the terminal portion. As for FIGS. 8A and 8B, only different parts from FIGS. 7A and 7B will be explained.

In a semiconductor device having a passive matrix type memory device shown in FIG. 8A, an element formation layer 351 is provided over a substrate 350, a memory element portion 352 is provided above the element formation layer 351, and a conductive layer 357 functioning as an antenna provided over a substrate 365 is connected to the element formation layer. Here, the memory element portion 352 or the conductive layer 357 functioning as an antenna is provided above the element formation layer 351. However, the structure is not limited thereto, and the memory element portion 356 can be provided below the element formation layer 351 or in the same layer, or the conductive layer 357 functioning as an antenna can also be provided below the element formation layer 351.

The memory element portion 352 can be formed by memory elements 352a and 352b having a structure shown in FIG. 7A.

The substrate including the element formation layer 351 and the memory element portion 352 and the substrate 365 provided with the conductive layer 357 functioning as an antenna are attached to each other with a resin 375 having adhesiveness. Then, a connection terminal 358 and the conductive layer 357 are electrically connected with each other through a conductive fine particle 359 included in the resin 375. In addition, by using a conductive adhesive such as a silver paste, a copper paste, or a carbon paste, or a method of conducting solder jointing, the substrate 350 including the element formation layer 351 and the memory element portion 352 and the substrate 365 provided with the conductive layer 357 functioning as an antenna may be attached to each other through the connection terminal 358 and the conductive layer 357 functioning as an antenna.

FIG. 8B shows a semiconductor device provided with the memory device as described in the Embodiment Mode 2. An element formation layer 351 including transistors 451 and 452 is provided over a substrate 350, a memory element portion 356 is provided above the element formation layer 351, and a conductive layer 357 functioning as an antenna provided over a substrate 365 is connected to the element formation layer. Here, the transistor 452 is provided in the same layer as the transistor 451 in the element formation layer 351, and the conductive layer 357 functioning as an antenna is provided above the element formation layer 351. However, the structure is not limited thereto, and the memory element portion 356 can be provided below the element formation layer 351 or in the same layer, or the conductive layer 357 functioning as an antenna can be provided below the element formation layer 351.

The memory element portion 356 can be formed by memory elements 356a and 356b having the structure of FIG. 7B.

In addition, also in FIG. 8B, the substrate including the element formation layer 351 and the memory element portion 356 and the substrate 365 provided with the conductive layer 357 functioning as an antenna are attached to each other with a resin 375 containing a conductive fine particle 359.

As described above, a semiconductor device including an organic memory and an antenna can be formed. In the present embodiment mode, an element formation layer can be provided by forming a thin film transistor over the substrate 350. Alternatively, an element formation layer may be provided by forming a field effect transistor over a substrate by using a semiconductor substrate such as Si, GaN, GaAs, or InP as the substrate 350. In addition, a SOI (silicon on insulator) substrate may be used as the substrate 350 to form an element formation layer thereover. In this case, the SOI substrate may be formed by using a method of attaching wafers or a method referred to as SIMOX (separation by implanted oxygen) in which an insulating layer is formed inside by implanting an oxygen ion into a Si substrate.

Furthermore, the memory element portions 352 and 356 may be provided over the substrate 365 provided with the conductive layer functioning as an antenna. In addition, as in the semiconductor device shown in FIGS. 7A and 7B, a sensor connected to the transistor 451 may also be provided.

It is to be noted that the present embodiment mode can be used by freely combining with the above embodiment modes.

By forming a memory element by using a conductive layer having a convex portion, a drive voltage at a time for writing of data can be reduced. As a result, a memory device and a semiconductor device consuming low power can be provided.

Embodiment 1

Figure 12A:
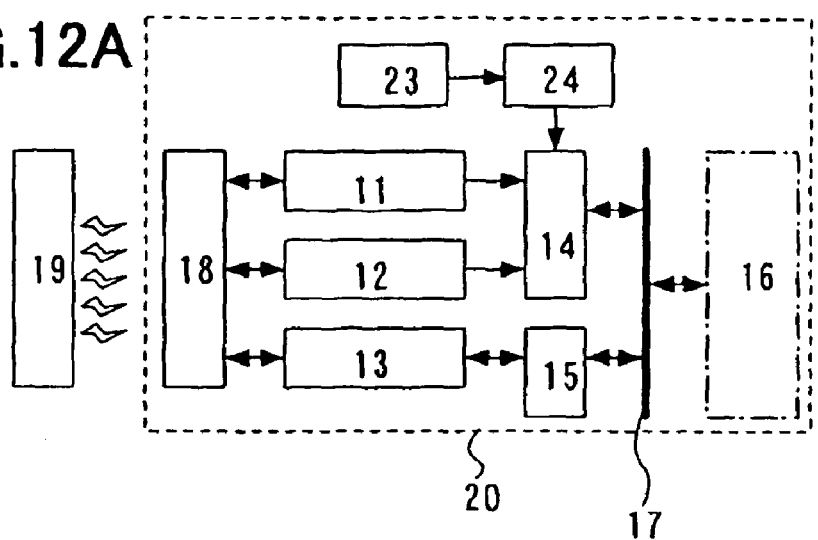
FIGS. 12A and 12B are diagrams illustrating a structural example of a semiconductor device according to the present invention and an electronic device having the semiconductor device.

A structure of a semiconductor device of the above embodiment modes will be described with reference to FIG. 12A. As shown in FIG. 12A, a semiconductor device 20 according to the present invention has a function of non-contact communication of data, and includes a power supply circuit 11, a clock generating circuit 12, a data demodulation/modulation circuit 13, a control circuit 14 for controlling other circuits, an interface circuit 15, a memory circuit 16, a data bus 17, an antenna (also referred to as an antenna coil) 18, a sensor 23, and a sensor circuit 24.

The power supply circuit 11 produces various kinds of voltages to be supplied to each circuit inside the semiconductor device 20 based on an AC signal inputted from the antenna 18. The clock generating circuit 12 produces various kinds of clock signal to be supplied to each circuit inside the semiconductor device 20 based on an AC signal inputted from the antenna 18. The data demodulation/modulation circuit 13 has a function of demodulating/modulating data communicated with a reader/writer 19. The control circuit 14 has a function of controlling the memory circuit 16. The antenna 18 has a function of transmitting/receiving electromagnetic field or waves. The reader/writer 19 communicates with and controls the semiconductor device, and control processing of the data thereof. It is to be noted that the structure of the semiconductor device is not limited to the above structure, and other elements, for example, a limiter circuit of a power supply voltage and hardware dedicated to encryption processing may be additionally provided.

The memory circuit 16 includes a memory element in which an organic compound layer or a phase change layer is interposed between a pair of conductive layers. It is to be noted that the memory circuit 16 may include only the memory element in which an organic compound layer or a phase change layer is interposed between a pair of conductive layers, or may include another memory circuit having a different structure. The memory circuit having a different structure corresponds to, for example, one or a plurality of circuits selected from a DRAM, an SRAM, an FeRAM, a mask ROM, a PROM, an EPROM, an EEPROM, or a flash memory.

The sensor 23 is formed by an element such as a resistive element, a capacitive coupling element, an inductive coupling element, a photovoltaic element, a photoelectric conversion element, a thermal electromotive force element, a transistor, a thermistor, or a diode. The sensor circuit 24 detects a change in impedance, reactance, inductance, voltage, or current, and performs analog/digital (A/D) conversion to output a signal to the control circuit 14.

Embodiment 2

In accordance with the present invention, a semiconductor device functioning as a wireless chip (also referred to as a wireless processor, a wireless memory, a wireless tag, an ID tag, an IC tag, an IC chip, an RF tag, an electronic tag, or an RFID tag) can be formed. As FIGS. 13A to 13F show examples, a semiconductor device 9210 can be used broadly, and may be used by being mounted in objects such as, for example, bills, coins, securities, bearer bonds, certificates (licenses, resident cards and the like, refer to FIG. 13A), containers for wrapping objects (wrapping paper, bottles and the like, refer to FIG. 13C), recording media (DVDs, video tapes and the like, refer to FIG. 13B), vehicles (bicycles and the like, refer to FIG. 13D), personal belongings (bags, glasses and the like), foods, plants, clothes, livingware, electronic devices, and shipping tags (refer to FIGS. 13E and 13F). The electronic devices include a liquid crystal display device, an EL display device, a television unit (also simply referred to as a TV, a TV receiver or a television receiver), a cellular phone, and the like.

The semiconductor device 9210 according to the present invention is mounted over a printed substrate, attached to the surface, or incorporated to be fixed in the object. For example, the semiconductor device may be incorporated in paper of a book, or an organic resin of a package to be fixed in each object. As for the semiconductor device 9210 according to the present invention, a compact size, a thin-shape and lightweight can be achieved so that an attractive design of the object itself is not damaged even after being fixed in the object. In addition, by providing the semiconductor device 9210 according to the present invention in bills, coins, securities, bearer bonds, certificates, and the like, a certification function can be obtained and forgery thereof can be prevented by making the use of the certification function. Further, by providing the semiconductor device in containers for wrapping objects, recording media, personal belongings, foods, clothes, livingware, electronic devices, and the like, a system such as an inspection system can be performed efficiently.

Figure 12B:
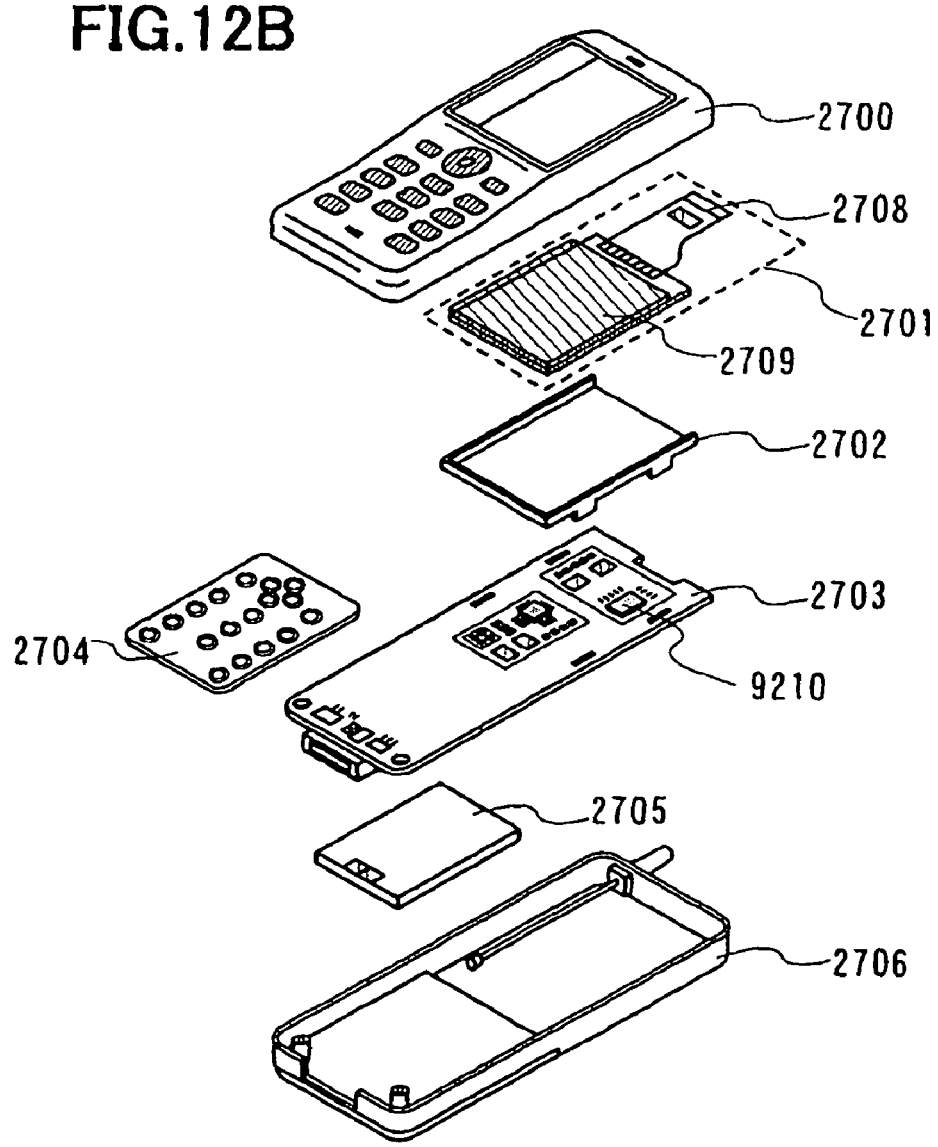
Figure 13A:
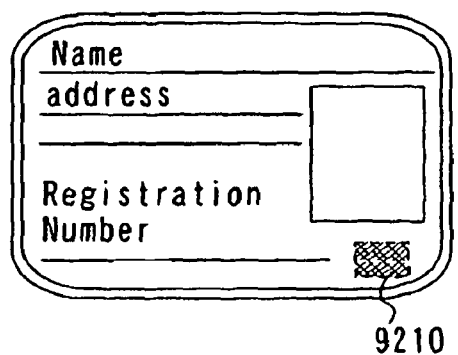
FIGS. 13A to 13F are diagrams illustrating examples of implementing a semiconductor device according to the present invention.
Figure 13B:
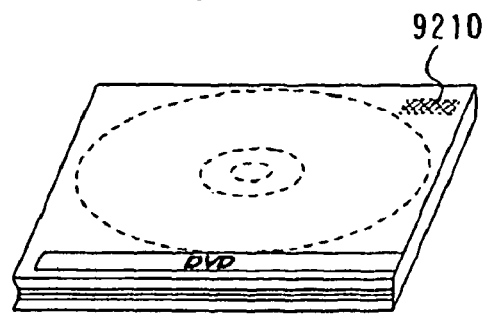
Figure 13C:
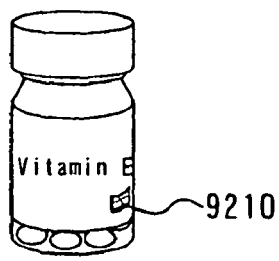
Figure 13D:
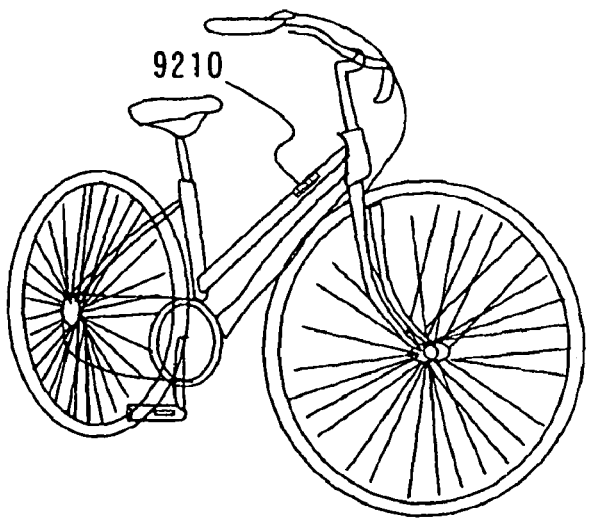
Figure 13E:
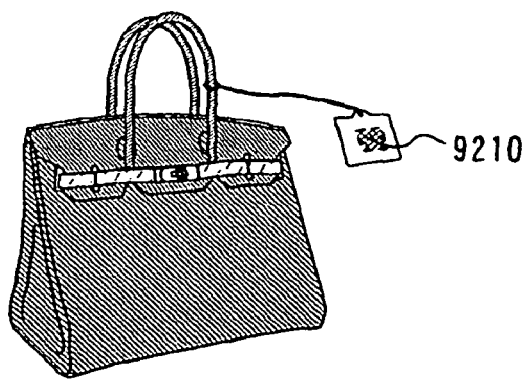
Figure 13F:
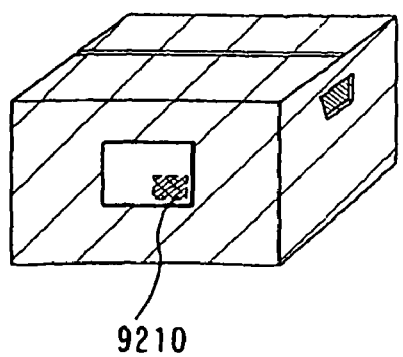

Subsequently, an example of an electronic device in which the semiconductor device 9210 according to the present invention is mounted will be described with reference to the drawing. The electronic device illustrated here is a cellular phone, which includes chassis 2700 and 2706, a panel 2701, a housing 2702, a printed wiring board 2703, operation buttons 2704, and a battery 2705 (refer to FIG. 12B). The panel 2701 is incorporated in the housing 2702 to be detachable, and the housing 2702 is set to the printed wiring board 2703. As for the housing 2702, a shape and a size thereof are appropriately changed depending on an electronic device in which the panel 2701 is incorporated. A plurality of semiconductor devices 9210 which are packaged are mounted over the printed wiring board 2703, and as one of the semiconductor devices, the semiconductor device according to the present invention can be used. A plurality of semiconductor devices mounted over the printed wiring board 2703 have a feature of any of a controller, a central processing unit (CPU), a memory, a power supply circuit, a sound processing circuit, a transmit/receive circuit and the like.

The panel 2701 is connected to the printed wiring board 2703 through a connection film 2708. The panel 2701, the housing 2702, and the printed wiring board 2703 are stored in the chassis 2700 and 2706 with the operation buttons 2704 and the battery 2705. A pixel region 2709 included in the panel 2701 is disposed so as to be recognized from an aperture provided in the chassis 2700.

As described above, the semiconductor device 9210 according to the present invention has features of a compact size, a thin shape and lightweight. By these features, limited space inside the chassis 2700 and 2706 of the electronic device can be used efficiently.

In addition, the semiconductor device according to the present invention includes a memory element having a simple structure in which an insulating layer is interposed between a pair of conductive layers; and thus, an electronic device using an inexpensive semiconductor device can be provided. Further, the semiconductor device according to the present invention includes a memory element formed by using a conductive layer having a convex portion; and thus, low power consumption can be achieved.

In addition, in the memory device of the semiconductor device according to the present invention, writing of data is conducted by an optical action or an electric action, and the memory device is involatile so that additional writing of data is possible. Therefore, an electronic device can be provided, in which forgery due to rewriting can be prevented and new data can be additionally written.

It is to be noted that the chassis 2700 and 2706 are shown as an example of an appearance shape of a cellular phone, but the electronic device relating to the present embodiment can be changed to various modes in accordance with a function or an application thereof.

The invention claimed is:

1. A memory device comprising:
   a memory cell array including memory cells arranged in a matrix,
   wherein a memory element in each of the memory cells comprising:
       a first conductive layer having a convex portion;
       an insulating layer over the first conductive layer and the convex portion; and
       a second conductive layer over and in direct contact with the insulating layer.

2. A memory device comprising:
   a memory cell array including memory cells arranged in a matrix; and
   a writing circuit,
   wherein a memory element in each of the memory cells comprising:
       a first conductive layer having a convex portion;
       an insulating layer over the first conductive layer and the convex portion; and
       a second conductive layer over and in direct contact with the insulating layer.

3. A memory device comprising:
   a memory cell array including memory cells arranged in a matrix; and
   a writing circuit,
   wherein the memory cell includes a transistor and a memory element; and
   wherein the memory element comprising:
       a first conductive layer having a convex portion;
       an insulating layer over the first conductive layer and the convex portion; and
       a second conductive layer over and in direct contact with the insulating layer.

4. The memory device according to any one of claims 1 to 3, wherein the first conductive layer and the second conductive layer are partly connected.

5. The memory device according to claim 2 or 3, wherein the memory cell array and the writing circuit are provided over a glass substrate or a flexible substrate.

6. The memory device according to claim 2 or 3, wherein the writing circuit comprises a thin film transistor.

7. The memory device according to claim 2 or 3, wherein the memory cell array and the writing circuit are provided over a single crystal semiconductor substrate.

8. The memory device according to claim 2 or 3, wherein the writing circuit comprises a field effect transistor.

9. The memory device according to any one of claims 1 to 3, wherein the first conductive layer has a plurality of convex portions.

10. The memory device according to any one of claims 1 to 3, wherein at least a part of the convex portion has a curved surface.

11. The memory device according to any one of claims 1 to 3, wherein the convex portion has a region, in which a sidewall face thereof is inclined at an angle of 10 degrees or more to 85 degrees or less with respect to a surface of the first conductive layer.

12. The memory device according to any one of claims 1 to 3, wherein a liquid-repellent layer is provided on a surface of the convex portion.

13. The memory device according to claim 2 or 3, wherein a resistance value of the memory element is changed by an optical action.

14. The memory device according to any one of claims 1 to 3, wherein the insulating layer comprises a conjugated polymer material doped with a photoacid generator.

15. The memory device according to claim 2 or 3, wherein a resistance value of the memory element is changed by an electric action.

16. The memory device according to any one of claims 1 to 3, wherein the insulating layer comprises an organic insulator.

17. The memory device according to any one of claims 1 to 3, wherein the insulating layer comprises at least one of an electron-transport material and a hole-transport material.

18. The memory device according to any one of claims 1 to 3, wherein the insulating layer comprises an inorganic insulator.

19. A semiconductor device comprising:
   a first transistor;
   a second transistor;
   a memory element connected to a conductive layer functioning as a source wiring or a drain wiring of the first transistor; and
   a conductive layer functioning as an antenna connected to a conductive layer functioning as a source wiring or a drain wiring of the second transistor,
   wherein the memory element comprising:
       a first conductive layer having a convex portion;
       an insulating layer over the first conductive layer and the convex portion; and
       a second conductive layer over the insulating layer.

20. The semiconductor device according to claim 19, wherein the first transistor and the memory element are connected to each other through a conductive fine particle.

21. The semiconductor device according to claim 19, wherein the second transistor and the antenna are connected to each other through a conductive fine particle.

22. The semiconductor device according to claim 19, wherein the first conductive layer and the second conductive layer are partly connected.

23. The semiconductor device according to claim 19, wherein the memory element is provided over a glass substrate or a flexible substrate.

24. The semiconductor device according to claim 19, wherein the first transistor and the second transistor comprise a thin film transistor.

25. The semiconductor device according to claim 19, wherein the memory element is provided over a single crystal semiconductor substrate.

26. The semiconductor device according to claim 19, wherein the first transistor and the second transistor comprise a field effect transistor.

27. The semiconductor device according to claim 19, wherein the first conductive layer has a plurality of convex portions.

28. The semiconductor device according to claim 19, wherein at least a part of the convex portion has a curved surface.

29. The semiconductor device according to claim 19, wherein the convex portion has a region, in which a sidewall face thereof is inclined at an angle of 10 degrees or more to 85 degrees or less with respect to a surface of the first conductive layer.

30. The semiconductor device according to claim 19, wherein a liquid-repellent layer is provided on a surface of the convex portion.

31. The semiconductor device according to claim 19, wherein a resistance value of the memory element is changed by an optical action.

32. The semiconductor device according to claim 19, wherein the insulating layer comprises a conjugated polymer material doped with a photoacid generator.

33. The semiconductor device according to claim 19, wherein a resistance value of the memory element is changed by an electric action.

34. The semiconductor device according to claim 19, wherein the insulating layer comprises an organic compound.

35. The semiconductor device according to claim 19, wherein the insulating layer comprises at least one of an electron-transport material and a hole-transport material.

36. The semiconductor device according to claim 19, wherein the insulating layer comprises an inorganic insulating layer.

37. The memory device according to any one of claims 1 to 3, wherein the convex portion is formed on the first conductive layer.

38. The semiconductor device according to claim 19, wherein the convex portion is formed on the first conductive layer.

39. The memory device according to claim 1, wherein the first conductive layer is provided over a glass substrate or a flexible substrate.

40. The memory device according to claim 1 or 2, further comprising a transistor electrically connected to the first conductive layer.

41. The memory device according to claim 3, wherein the transistor is electrically connected to the first conductive layer.

42. The semiconductor device according to claim 19, wherein the second conductive layer is in contact with the insulating layer.

* * * * *